US012787778B2

(12) United States Patent
Arrington et al.

(10) Patent No.: US 12,787,778 B2
(45) Date of Patent: Nov. 3, 2026

(54) METHODS, SYSTEMS, APPARATUS, AND ARTICLES OF MANUFACTURE TO COOL INTEGRATED CIRCUIT PACKAGES HAVING GLASS SUBSTRATES

(71) Applicant: Intel Corporation, Santa Clara, CA (US)

(72) Inventors: Kyle Arrington, Gilbert, AZ (US); Bohan Shan, Chandler, AZ (US); Haobo Chen, Chandler, AZ (US); Ziyin Lin, Chandler, AZ (US); Hongxia Feng, Chandler, AZ (US); Yiqun Bai, Chandler, AZ (US); Dingying Xu, Chandler, AZ (US); Xiaoying Guo, Chandler, AZ (US); Bai Nie, Chandler, AZ (US); Srinivas Pietambaram, Chandler, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 18/069,507

(22) Filed: Dec. 21, 2022

(65) Prior Publication Data

US 2024/0213116 A1 Jun. 27, 2024

(51) Int. Cl.
*H10W 40/47* (2026.01)
*H10W 40/43* (2026.01)
*H10W 70/60* (2026.01)
*H10W 70/685* (2026.01)
*H10W 70/692* (2026.01)

(52) U.S. Cl.
CPC ........... *H10W 40/47* (2026.01); *H10W 40/43* (2026.01); *H10W 70/611* (2026.01); *H10W 70/685* (2026.01); *H10W 70/692* (2026.01)

(58) Field of Classification Search
CPC ... H10W 40/47; H10W 40/43; H10W 70/611; H10W 70/685; H10W 70/692; H10W 70/635
See application file for complete search history.

(56) References Cited

U.S. PATENT DOCUMENTS

| | | | | |
|---|---|---|---|---|
| 2008/0259125 | A1* | 10/2008 | Haluzak | B41J 2/1628 257/E21.705 |
| 2020/0098668 | A1* | 3/2020 | Eid | H10W 40/47 |
| 2022/0406686 | A1 | 12/2022 | Aleksov et al. | |

* cited by examiner

*Primary Examiner* — Fernando L Toledo
*Assistant Examiner* — Adam S Bowen
(74) *Attorney, Agent, or Firm* — Hanley, Flight & Zimmerman, LLC

(57) ABSTRACT

Methods, systems, apparatus, and articles of manufacture to cool integrated circuit packages having glass substrates are disclosed. An example glass core of an integrated circuit (IC) package disclosed herein includes a fluid inlet to receive a cooling fluid, a fluid outlet, and a channel to fluidly couple the fluid inlet to the fluid outlet, the cooling fluid to flow through the channel from the fluid inlet to the fluid outlet, the channel fluidly isolated from one or more vias extending between a first surface and a second surface of the glass core.

19 Claims, 19 Drawing Sheets

METHODS, SYSTEMS, APPARATUS, AND ARTICLES OF MANUFACTURE TO COOL INTEGRATED CIRCUIT PACKAGES HAVING GLASS SUBSTRATES

FIELD OF THE DISCLOSURE

This disclosure relates generally to integrated circuit packages and, more particularly, to methods, systems, apparatus, and articles of manufacture to cool integrated circuit packages having glass substrates.

BACKGROUND

In many electronic devices, integrated circuit (IC) chips and/or semiconductor dies are connected to larger circuit boards such as motherboards and/or other types of printed circuit boards (PCBs) via a package substrate. During operation, one or more of the IC chips (e.g., processor chips and/or memory chips) may generate heat. Some electronic devices include a cooling system (e.g., a liquid cooling system, a heatsink, etc.) to dissipate heat from the electronic device.

Figure 1:
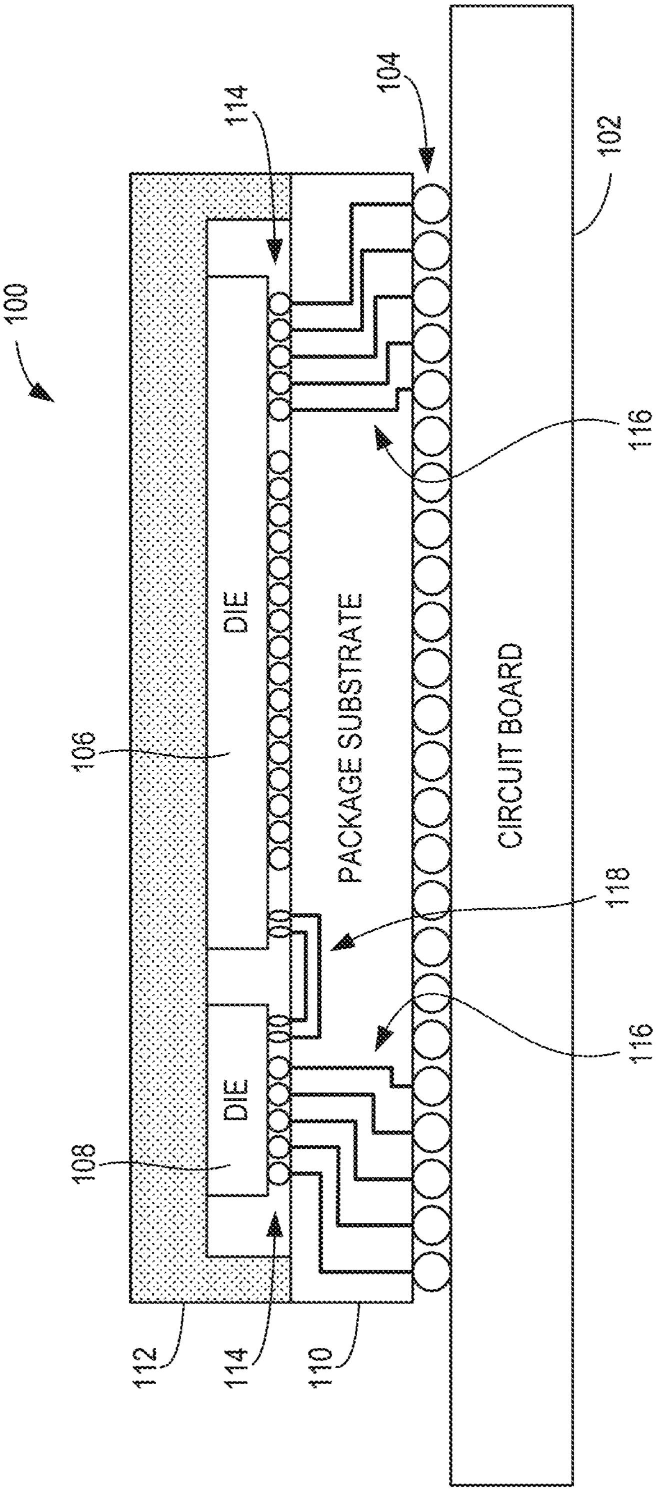
FIG. 1 illustrates an example integrated circuit (IC) package on a printed circuit board.

In general, the same reference numbers will be used throughout the drawing(s) and accompanying written description to refer to the same or like parts. The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description. As used herein "substantially real time" refers to occurrence in a near instantaneous manner recognizing there may be real world delays for computing time, transmission, etc. Thus, unless otherwise specified, "substantially real time" refers to real time+/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

DETAILED DESCRIPTION

During operation of an electronic device, one or more electronic components (e.g., a land grid array (LGA) processor chip, a ball grid array (BGA) processor chip, a pin grid array (PGA) processor chip, a memory chip, other types of integrated circuit (IC) packages or semiconductor devices, etc.) of the electronic device may generate heat. In some cases, excessive heat may cause overheating and, thus, degradation in performance of the electronic components. To prevent overheating, some electronic devices include a cooling system to facilitate heat transfer from the electronic components and/or otherwise enable cooling thereof. For instance, the cooling system may include a heatsink thermally coupled to one or more of the electronic components, where heat from the electronic components is transferred to fins of the heatsink and dissipated to the environment. In some cases, the cooling system is a liquid cooling system in which a cooling fluid (e.g., liquid and/or air) is provided to the electronic components to facilitate transfer of heat therefrom. In many IC packages, the electronic components are mechanically and/or electrically coupled to one side of a package substrate, and the cooling system is provided on the same side of the package substrate. In such cases, the cooling system enables single-sided cooling of the electronic components.

Examples disclosed herein improve efficiency of cooling one or more electronic components of an IC package by enabling cooling on a substrate side (e.g., a first side) of the one or more electronic components. Some examples disclosed herein may be used along with other cooling systems (e.g., heatsinks and/or a liquid cooling system) that cool the electronic components on a second side of the electronic components, such that examples disclosed herein enable double-sided cooling of the electronic components. Example IC package(s) disclosed herein include an example glass core in a package substrate, where the glass core includes an example channel (e.g., a micro-channel) extending between a fluid inlet and a fluid outlet of the glass core. In some examples, the channel receives a cooling fluid (e.g., liquid and/or air) which flows through the channel and facilitates cooling of the electronic components on the substrate side of the electronic components. In some examples, the channel is fluidly isolated from vias (e.g., through-glass vias (TGVs)) extending between first and second surfaces of the glass core. In some examples, a volume of the channel in the glass core changes along the glass core. For example, spacing between passages of the channel may be reduced and/or a cross-sectional width of the channel may be increased in a first region of the glass core compared to other regions of the glass core, such that a rate of heat transfer may be greater at the first region compared to the other regions of the glass core. Advantageously, by enabling cooling of electronic components on a substrate side of the electronic components, examples disclosed herein increase efficiency of cooling the IC package compared to traditional cooling systems (e.g., heatsinks and/or liquid cooling systems acting on a single side of the electronic components) used alone.

FIG. 1 illustrates an integrated circuit (IC) package 100 electrically coupled to a printed circuit board (PCB) 102. In some examples, the IC package 100 is electrically coupled to the circuit board 102 by first electrical connections 104. The first electrical connections 104 may include pins, pads, bumps, and/or balls to enable the electrical coupling of the IC package 100 to the circuit board 102. In this example, the IC package 100 includes two semiconductor (e.g., silicon) dies 106, 108 that are mounted to a package substrate 110 and enclosed by a package lid or mold compound 112. While the example IC package 100 of FIG. 1 includes two dies 106, 108, in other examples, the IC package 100 may have fewer or more than two dies.

As shown in the illustrated example, each of the dies 106, 108 is electrically and mechanically coupled to the package substrate 110 via second electrical connections 114. The second electrical connections 114 may include pins, pads, balls, and/or bumps. The second electrical connections 114 between the dies 106, 108 and the package substrate 110 are sometimes referred to as first level interconnects. By contrast, the first electrical connections 104 between the IC package 100 and the circuit board 102 are sometimes referred to as second level interconnects. In some examples, one or both of the dies 106, 108 may be stacked on top of one or more other dies and/or an interposer. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer.

As shown in the illustrated example, the package substrate 110 includes first electrical traces and/or circuit lines (e.g., routing) 116 that electrically connect the first electrical connections 104 to the second electrical connections 114, thereby enabling the electrical coupling of the first and/or second dies 106, 108 with the circuit board 102. Further, in some examples, the package substrate 110 includes second electrical traces and/or circuits (e.g., routing) 118 that electrically connect different ones of the first electrical connections 104 associated with the first and second dies 106, 108, thereby enabling the electrical coupling of the first and second dies 106, 108.

Figure 2:
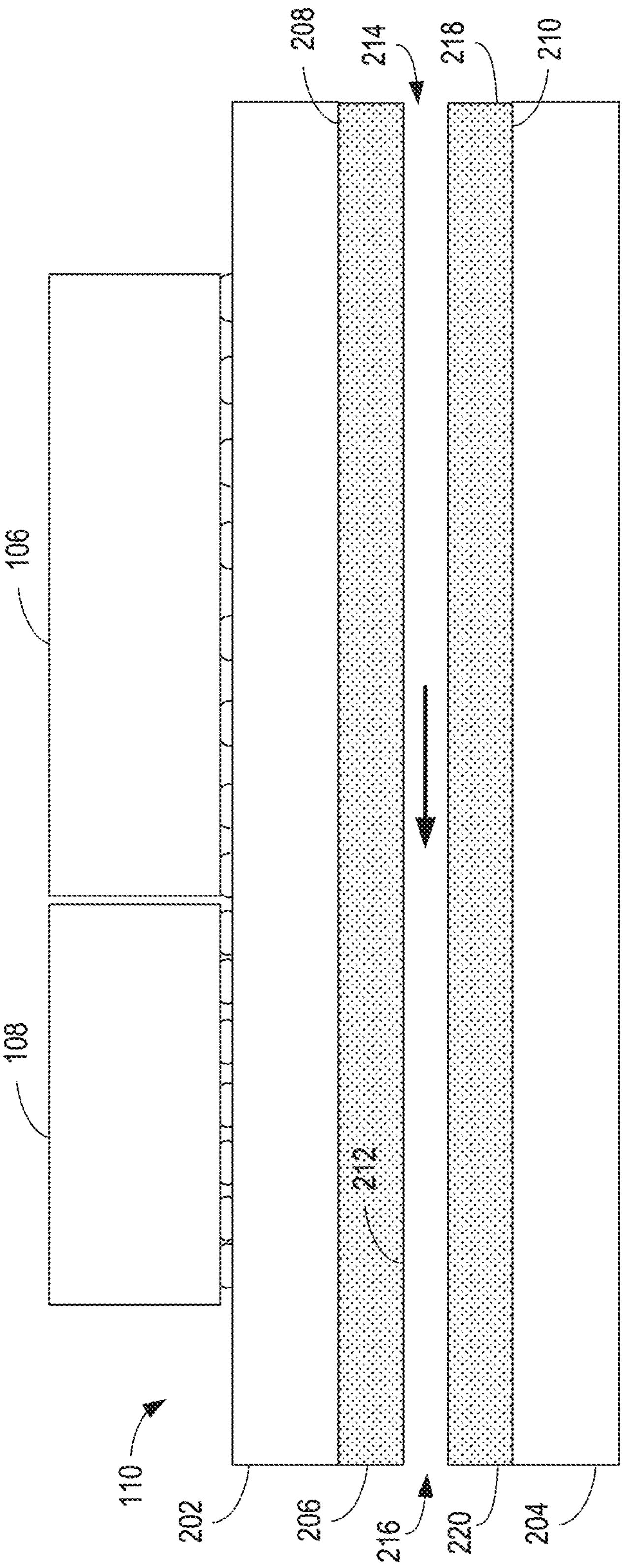
FIG. 2 is a cross-sectional view of an example package substrate that may be implemented in the IC package of FIG. 1.

FIG. 2 is a cross-sectional view of an example implementation of the IC package 110 of FIG. 1. The package 110 of the illustrated example includes first example build-up layers 202, second example build-up layers 204, and an example glass core (e.g., a glass substrate) 206. Specifically, the first build-up layers 202 are provided on a first example surface 208 of the glass core 206 and the second build-up layers 204 are provided on a second example surface 210 of the glass core 206 opposite the first surface 208. In some examples, the build-up layers 202, 204 are provided in an alternating pattern of insulation of dielectric layers and patterned conductive layers providing a plurality of traces between the dielectric layers. In some examples, the traces define signal traces or electrical circuits (e.g., routing, signaling or transmission lines) to transfer signals or information between various (e.g., two or more) components (e.g., the dies 106, 108) of an associated IC package (e.g., the IC package 100 of FIG. 1).

Although the glass core 206 of the example package substrate 110 is shown as a central core of the package substrate 110, in some examples, the glass core 206 can be an interposer and/or any other layer of the package substrate 110. For example, the glass core 206 can be used in place of one or more dielectric layers of the package substrate 110. In some examples, the glass core 206 can be composed of different material(s) including organic materials, silicon, and other conventional materials for fabricating package substrates. In some examples, the build-up layers 202, 204 can be provided on the glass core 206 using semiconductor manufacturing techniques or processes including, but not limited to, photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes for manufacture of semiconductor devices.

In the illustrated example of FIG. 2, the glass core 206 includes an example channel (e.g., a micro-channel) 212 extending between an example fluid inlet 214 and an example fluid outlet 216 of the package substrate 110. In some examples, cooling fluid is provided to the channel 212 at the fluid inlet 214, and the cooling fluid flows through the channel 212 from the fluid inlet 214 to the fluid outlet 216. In some examples, as the cooling fluid flows through the channel 212, heat from the package substrate 110 and/or one or more devices (e.g., the dies 106, 108) coupled to the package substrate 110 is transferred to the cooling fluid, thus cooling the package substrate 110 and/or the devices. In some examples, the cooling fluid can include a single-phase fluid and/or a multi-phase fluid. In some examples, the cooling fluid includes at least one of air, water, chlorofluorocarbons (CFCs), oil, immersion fluid, etc.

In the illustrated example of FIG. 2, the fluid inlet 214 is positioned on a first example side (e.g., a first edge) 218 of the glass core 206 and the fluid outlet 216 is positioned on a second example side (e.g., a second edge) 220 of the glass core 206. In some examples, the fluid inlet 214 and the fluid outlet 216 are positioned on a same side (e.g., the first side 218 or the second side 220) of the glass core 206. In some examples, at least one of the fluid inlet 214 or the fluid outlet 216 is positioned on the first surface (e.g., an upper surface, a top surface, etc.) 208 or the second surface (e.g., a lower surface, a bottom surface, etc.) 210 of the glass core 206. In some such examples, the channel 212 at least partially extends into at least one of the first build-up layers 202 or the second build-up layers 204.

Figure 3A:
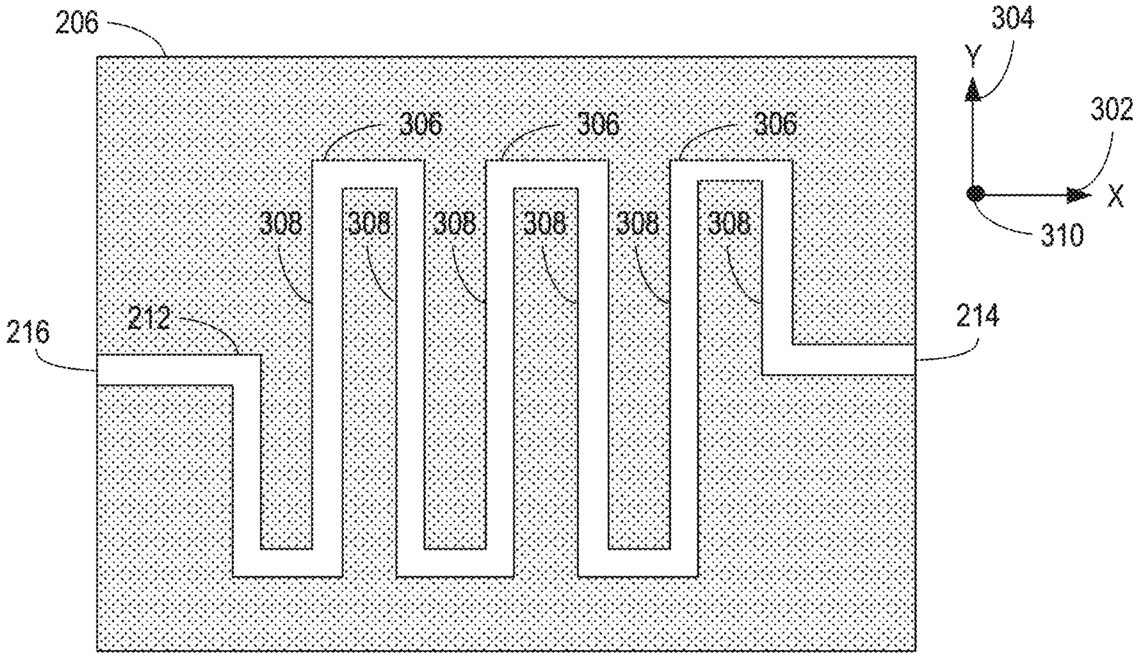
FIG. 3A is a plan view of an example glass core of the example package substrate of FIG. 2 including an example channel.

FIG. 3A illustrates a plan view of the example glass core 206 of FIG. 2. In the illustrated example of FIG. 3A, the channel 212 extends between the fluid inlet 214 and the fluid outlet 216 along an example X-Y plane (defined by example X and Y axes 302, 304 in FIG. 3A), where the X-Y plane is substantially parallel to at least one of the first surface 208 or the second surface 210 of the glass core 206 of FIG. 2. In this example, the channel 212 includes multiple example bends (e.g., curves, loops) 306 and multiple example passages (e.g., alternating passages, straight portions, straight sections) 308 between the bends 306. In this example, the passages 308 are evenly spaced along the X-Y plane. In some examples, the spacing between adjacent ones of the passages 308 may be different at different locations, such that a volume (e.g., a concentration) of the channel 212 in the glass core 206 may be greater in one region of the glass core 206 compared to other regions of the glass core 206. In the illustrated example, a cross-sectional width of the channel 212 is constant (e.g., substantially constant) along a length of the channel 212 between the fluid inlet 214 and the fluid outlet 216. In some examples, the cross-sectional width of the channel 212 may increase or decrease along one or more portions of the channel 212.

In this example, the bends 306 include 90-degree bends. In some examples, at least one of the bends 306 may be different (e.g., include bends that are less than 90 degrees or greater than 90 degrees). In some examples, a number of the passages 308 and/or bends 306 in the channel 212 may be different. For example, the channel 212 may include fewer or more passages 308 and/or bends 306 than shown in FIG. 3A. In some examples, one or more of the bends 306 and/or the passages 308 may be oriented along an example Z axis 310 oriented out of the page in FIG. 3A (orthogonal to the X and Y axes 302, 304). In other words, the shape and/or geometry of the channel 212 may be different from that shown in FIG. 3A. While the one channel 212 is shown in FIG. 3A, multiple channels may be included in the glass core 206, where a geometry and/or shape of the multiple channels can be the same as or different from the channel 212 shown in FIG. 3A. In some such examples, the multiple channels may be fluidly coupled to the fluid inlet 214 and the fluid outlet 216 of FIG. 3A. In some examples, one or more of the multiple channels may be fluidly coupled to one or more different fluid inlets and/or fluid outlets provided in the glass core 206.

Figure 3B:
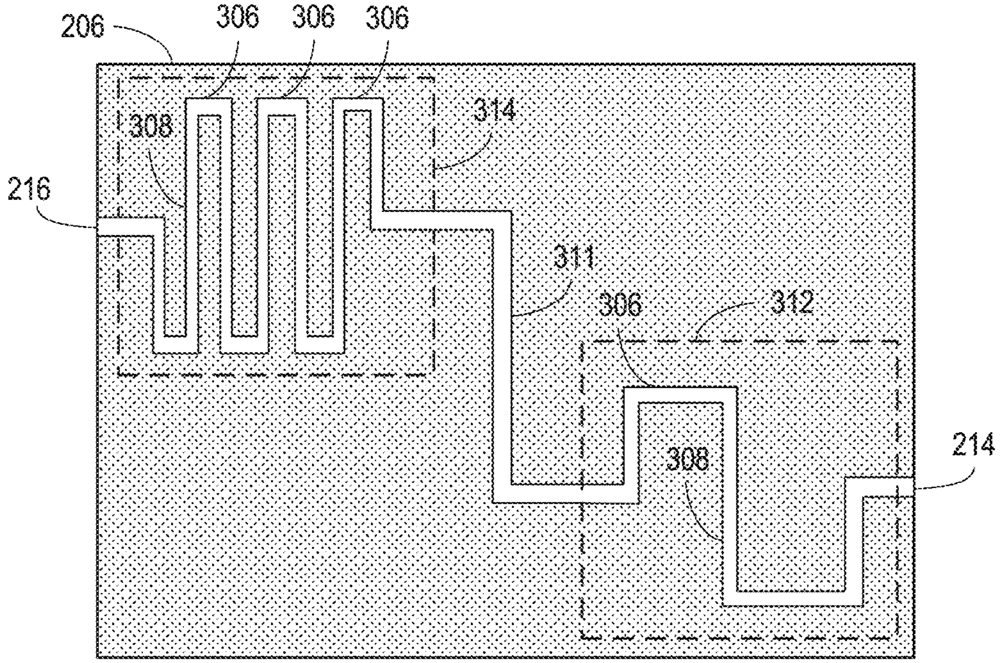
FIG. 3B illustrates a glass core similar to the glass core of FIG. 3A but having a channel with different geometry and/or shape than that shown in FIG. 3A.

FIG. 3B illustrates the glass core 206 including a second example channel 311 having a different geometry and/or shape than that of the channel 212 shown in FIG. 3A. In some examples, a different number of the passages 308 and/or a different spacing between the passages 308 may be used to increase effectiveness of heat transfer in one or more regions of the glass core 206. For example, in FIG. 3B, the second channel 311 includes a first number of the passages 308 and corresponding ones of the bends 306 in a first example region 312 of the glass core 206, and a second number of the passages 308 and corresponding ones of the bends 306 in a second example region 314 of the glass core 206. In this example, a volume of the channel 311 and/or a number of the passages 308 in the first and second regions of the glass core 206 is greater than a volume and/or a number of the passages 308 of the channel 311 in other regions of the glass core 206 (e.g., outside of the first and second regions 312, 314). Accordingly, an amount of cooling fluid in the channel 311 is greater in the first and second regions 312, 314 compared to the other regions of the glass core 206. As a result, heat transfer to the cooling fluid in the channel 311 is greater at the first and second regions 312, 314, compared to the other regions of the glass core 206. In some examples, the first region 312 corresponds to a first location of a first device (e.g., the first die 106) coupled to the package substrate 110 of FIGS. 1 and/or 2, and the second region 314 corresponds to a second location of a second device (e.g., the second die 108) coupled to the package substrate 110.

In some examples, the glass core 206 can be manufactured using direct glass-to-glass bonding (e.g., with no bonding material between glass panels of the glass core 206) as described in connection with FIGS. 4-8 below. In some examples, the glass core 206 can be manufactured using one or more PID layers as described in connection with FIGS. 9-13 below. In some examples, one or more different methods and/or processes can be used to manufacture the glass core 206.

Figure 4:
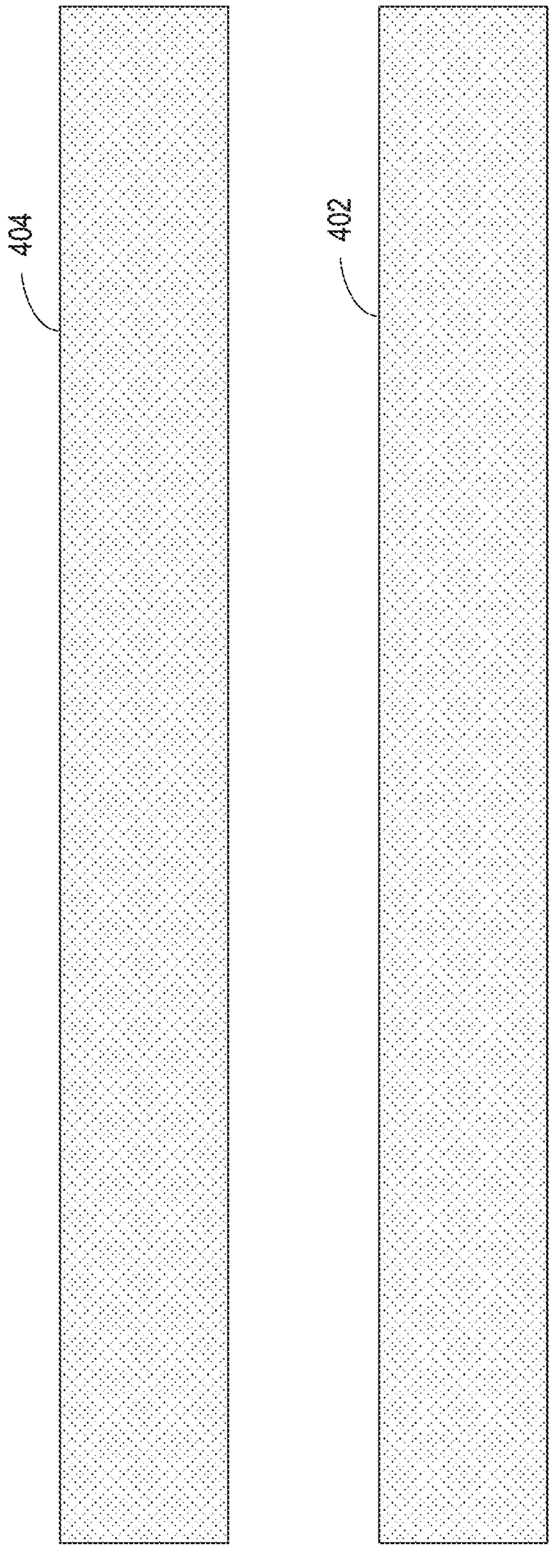
FIG. 4 is a side view of first and second example glass panels used to produce the example glass core of FIGS. 2, 3A, and/or 3B.

FIG. 4 is a side view of a first example glass panel (e.g., a first glass substrate) 402 and a second example glass panel (e.g., a second glass substrate) 404 used to produce the example glass core 206 of FIGS. 2, 3A, and/or 3B. In this example, the glass panels 402, 404 have a substantially similar size, shape, and/or thickness. In some examples, a size, shape, and/or thickness of the first glass panel 402 may be different from a size, shape, and/or thickness of the second glass panel 404. For example, the first glass panel 402 may have a first thickness and the second glass panel 404 may have a second thickness, where the first thickness is greater than the second thickness. While the glass panels 402, 404 are glass in this example, the glass panels 402, 404 may include one or more additional materials (e.g., epoxy with glass fibers) therein. In some examples, two of the glass panels 402, 404 are used to produce the example glass core 206. In some examples, one or more additional glass panels may be included in the glass core 206.

Figure 5:
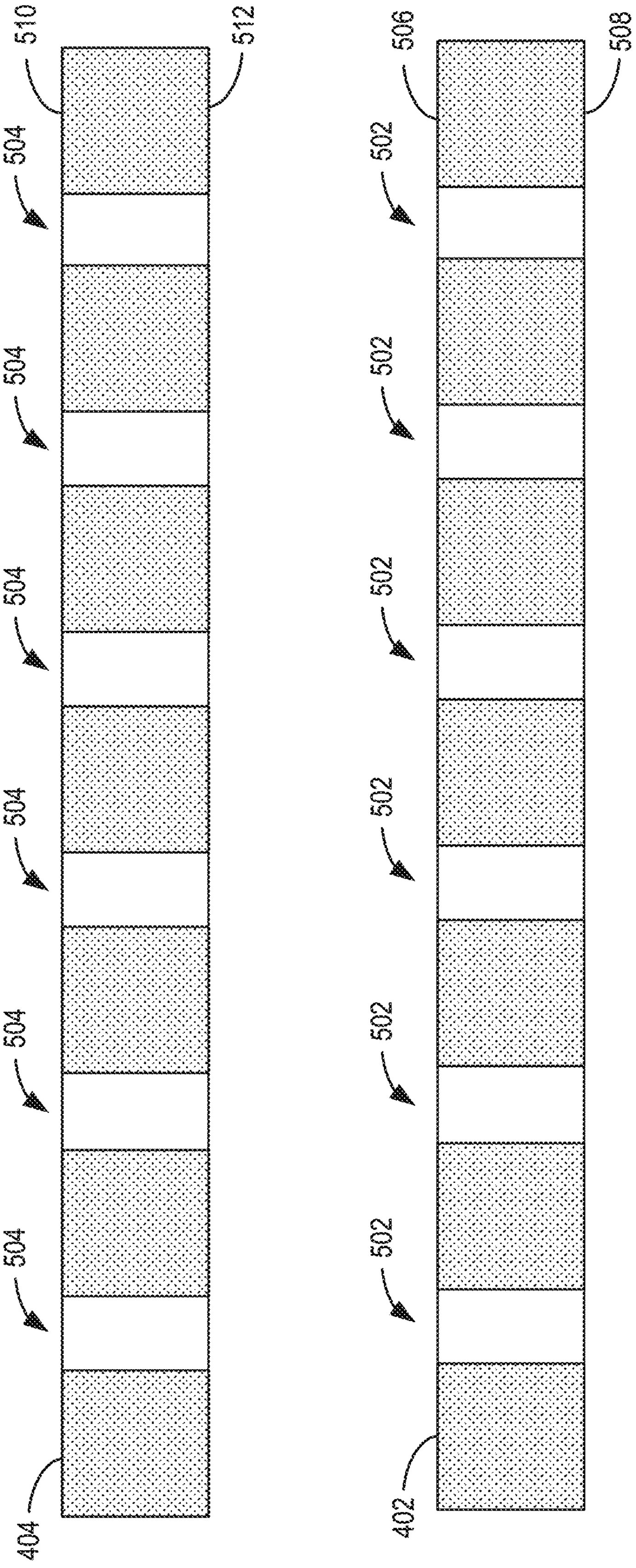
FIG. 5 illustrates first and second example vias provided in the first and second glass panels of FIG. 4.

FIG. 5 illustrates example vias (e.g., through-glass vias (TGVs)) 502, 504 provided in the first and second example glass panels 402, 404 of FIG. 4. In the illustrated example of FIG. 5, the first example vias 502 correspond to first openings extending from a first example surface 506 to a second example surface 508 of the first glass panel 402, and the second example TGVs 504 correspond to second openings extending from a third example surface 510 to a fourth example surface 512 of the second glass panel 404. In some examples, the vias 502, 504 are provided in the respective ones of the glass panels 402, 404 by etching and/or drilling into the glass panels 402, 404.

In the illustrated example, the vias 502, 504 are cylindrical and have a circular cross-sectional shape. In some examples, a different cross-sectional shape (e.g., square, hexagonal, elliptical, etc.) may be used instead. In this example, a cross-sectional diameter of the vias 502, 504 is constant (e.g., not changing) between the first and second surfaces 506, 508 and/or between the third and fourth surfaces 510, 512. In some examples, the cross-sectional diameter may vary (e.g., increase and/or decrease) from the first surface 506 to the second surface 508 and/or from the third surface 510 to the fourth surface 512. In some examples, the vias 502, 504 are arranged in a two-dimensional array along the respective surfaces 506, 508, 510, 512 of the glass panels 402, 404. In this example, a size, spacing, and/or arrangement of the first vias 502 is substantially the same as a size, spacing, and/or arrangement of the second vias 504.

Figure 6:
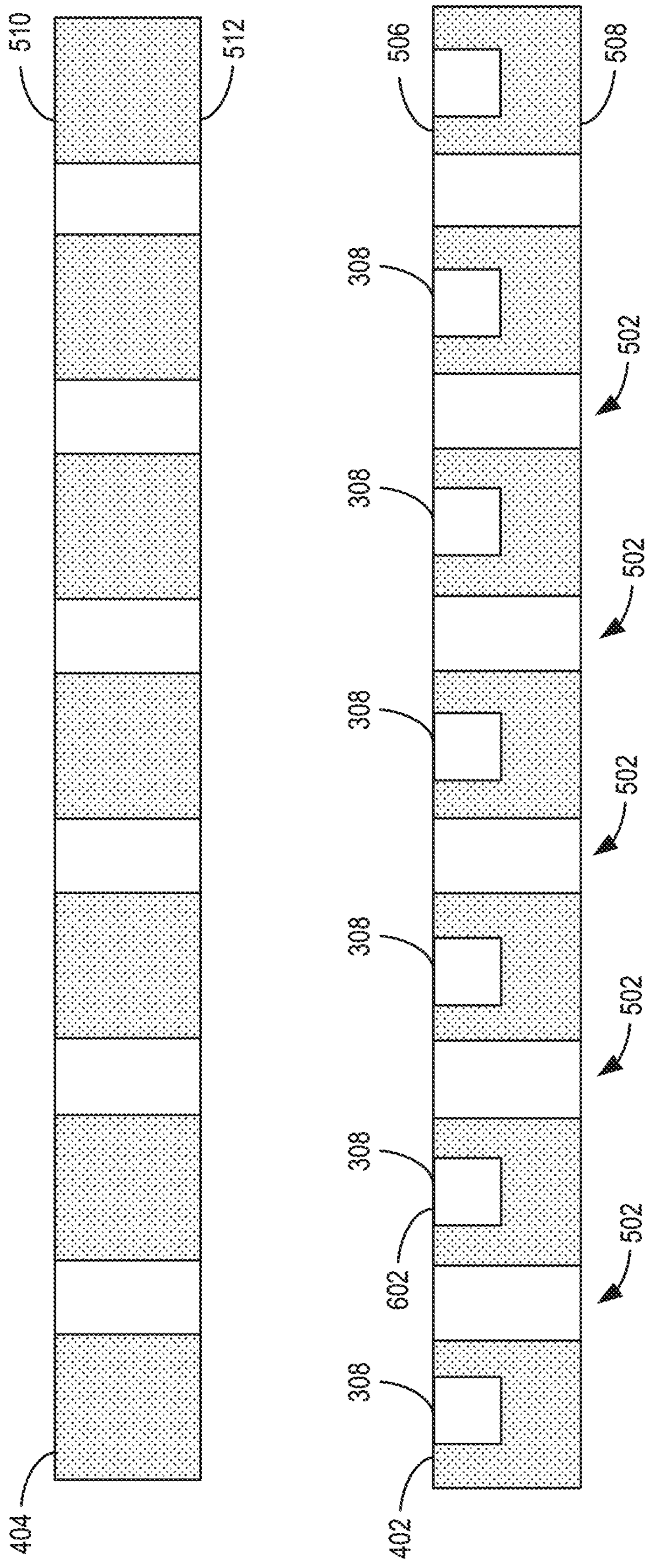
FIG. 6 illustrates an example trench provided in a first example surface of the first glass panel of FIG. 5.

FIG. 6 illustrates an example trench 602 provided in the first glass panel 402 of FIG. 5. In the illustrated example of FIG. 6, the trench 602 defines a portion of the channel 212 of FIGS. 2, 3A, and/or 3B. In this example, the trench 602 extends into the first glass panel 402 by a distance less than the first thickness of the first glass panel 402. In this example, each of the passages 308 of the trench 602 and/or the channel 212 is positioned between respective ones of the first vias 502 in the first glass panel 402. In some examples, two or more of the passages 308 are positioned between respective ones of the first vias 502. In some examples, ones of the first vias 502 do not have a corresponding one of the passages 308 positioned therebetween.

In some examples, the channel 212 may be provided in the fourth surface 512 of the second glass panel 404 in addition to or instead of the first glass panel 402. In some examples, a first portion of the channel 212 is provided in the first surface 506 of the first glass panel 402, and a second portion of the channel 212 is provided in the fourth surface 512 of the second glass panel 404. In some examples, the channel 212 is provided in the first glass panel 402 by etching, drilling, etc.

In the illustrated example of FIG. 6, the channel 212 has a rectangular cross-sectional shape. In other examples, the cross-sectional shape of the channel 212 may be different (e.g., triangular, rounded, etc.). In some examples, a cross-sectional width of the channel 212 is between 50 microns and 500 microns. In some examples, the cross-section width of the channel 212 is greater than 500 microns or less than 50 microns. In some examples, the cross-sectional width of the channel 212 is up to 300 microns, up to 200 microns, etc.

Figure 7:
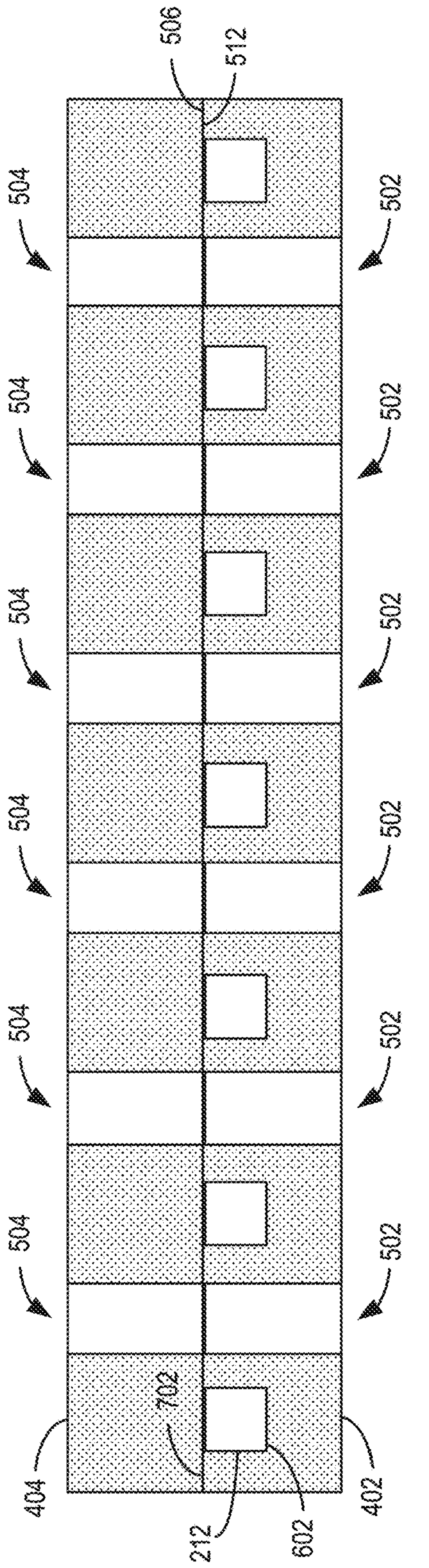
FIG. 7 illustrates the second glass panel coupled to the first glass panel of FIG. 6 using direct glass-to-glass bonding.

FIG. 7 illustrates the second glass panel 404 coupled (e.g., bonded) to the first glass panel 402. In this example, the first and second glass panels 402, 404 are coupled together via direct glass-to-glass bonding. For example, the first and second glass panels 402, 404 are positioned such that the first surface 506 of the first glass panel 402 abuts (e.g., contacts) the fourth surface 512 of the second glass panel 404, and the first vias 502 of the first glass panel 402 are substantially aligned with the second vias 504 of the second glass panel 404. After positioning of the first and second glass panels 402, 404, pressure and/or heat is applied to the first glass panel 402 and/or the second glass panel 404 to bond (e.g., by direct glass-to-glass bonding) the first surface 506 and the fourth surface 512 at an example interface 702 therebetween. In some examples, the interface 702 can be detected based on material differences (e.g., phase difference, morphology difference) at the interface 702 resulting from heating and/or pressing of the first and second glass panels 402, 404. In some examples, the interface 702 can be detected based on misalignment between the first and second glass panels 402, 404 during bonding. In some examples, the interface 702 is undetectable as a result of direct glass-to-glass bonding, such that the first and second glass panels 402, 404 are a substantially continuous material at the interface 702.

In some examples, when the second glass panel 404 is coupled to the first glass panel 402, the trench 602 and the second glass panel 404 define the channel 212 of FIGS. 2, 3A, and/or 3B. In this example, the second glass panel 404 seals the channel 212 at the interface 702, such that fluid from the channel 212 is prevented from exiting the channel 212 through the interface 702. As such, the channel 212 is fluidly isolated from the first and second vias 502, 504.

Figure 8:
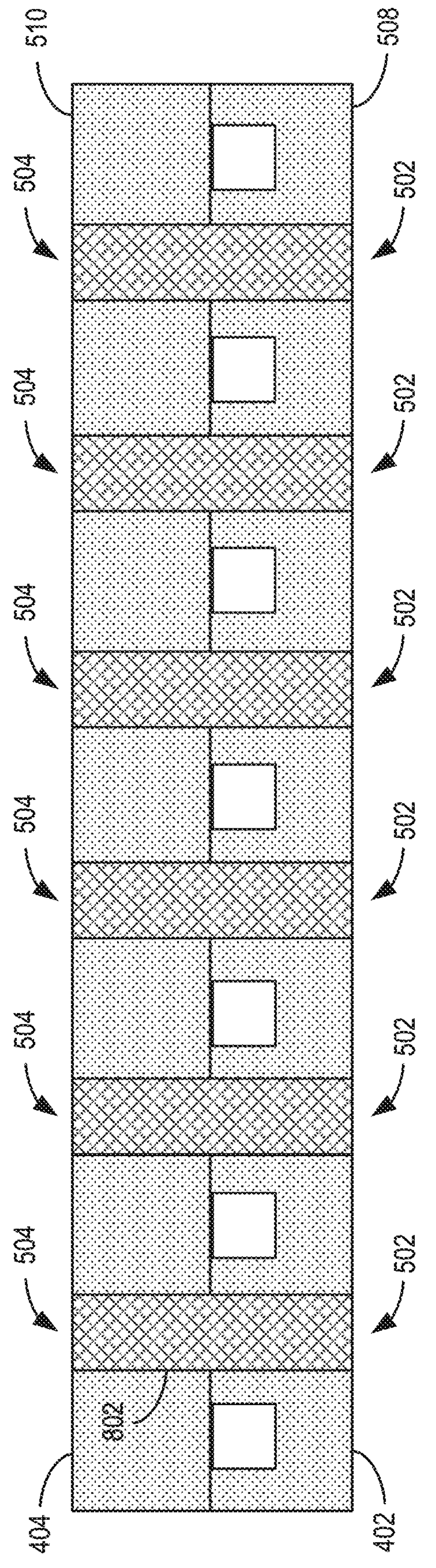
FIG. 8 illustrates copper material provided in the first and second vias of the first and second glass panels of FIG. 7 to produce example metal interconnects.

FIG. 8 illustrates example copper material (e.g., copper plating) 802 provided in the first and second example vias 502, 504 to produce metal interconnects. In some examples, the copper material 802 is provided in one or more layers to produce a coating on inner surfaces of the vias 502, 504. In some examples, the copper material 802 substantially fills the vias 502, 504 between the second surface 508 of the first glass panel 402 and the third surface 510 of the second glass panel 404. In some examples, the copper material 802 produces metal interconnects to communicatively and/or electrically couple one or more electrical components (e.g., the dies 106, 108 of FIGS. 1 and/or 2) on a first side of the package substrate 110 of FIG. 2 to one or more electrical components (e.g., the circuit board 102 of FIG. 1) on a second side of the package substrate 110. In particular, the copper material 802 allows electrical signals to travel through the vias 502, 504 and between the electrical components on opposite sides of the package substrate 110. In some examples, after the copper material 802 is provided in the vias 502, 504, the example build-up layers 202, 204 of FIG. 2 can be provided and/or deposited on the respective second and third surfaces 508, 510 to produce the package substrate 110 of FIG. 2. While an example process for manufacturing the glass core 206 of FIG. 2 using direct glass-to-glass bonding is described in connection with FIGS. 4-8 above, an alternative process for manufacturing the glass core 206 using one or more PID layers is described in connection with FIGS. 9-13 below.

Figure 9:
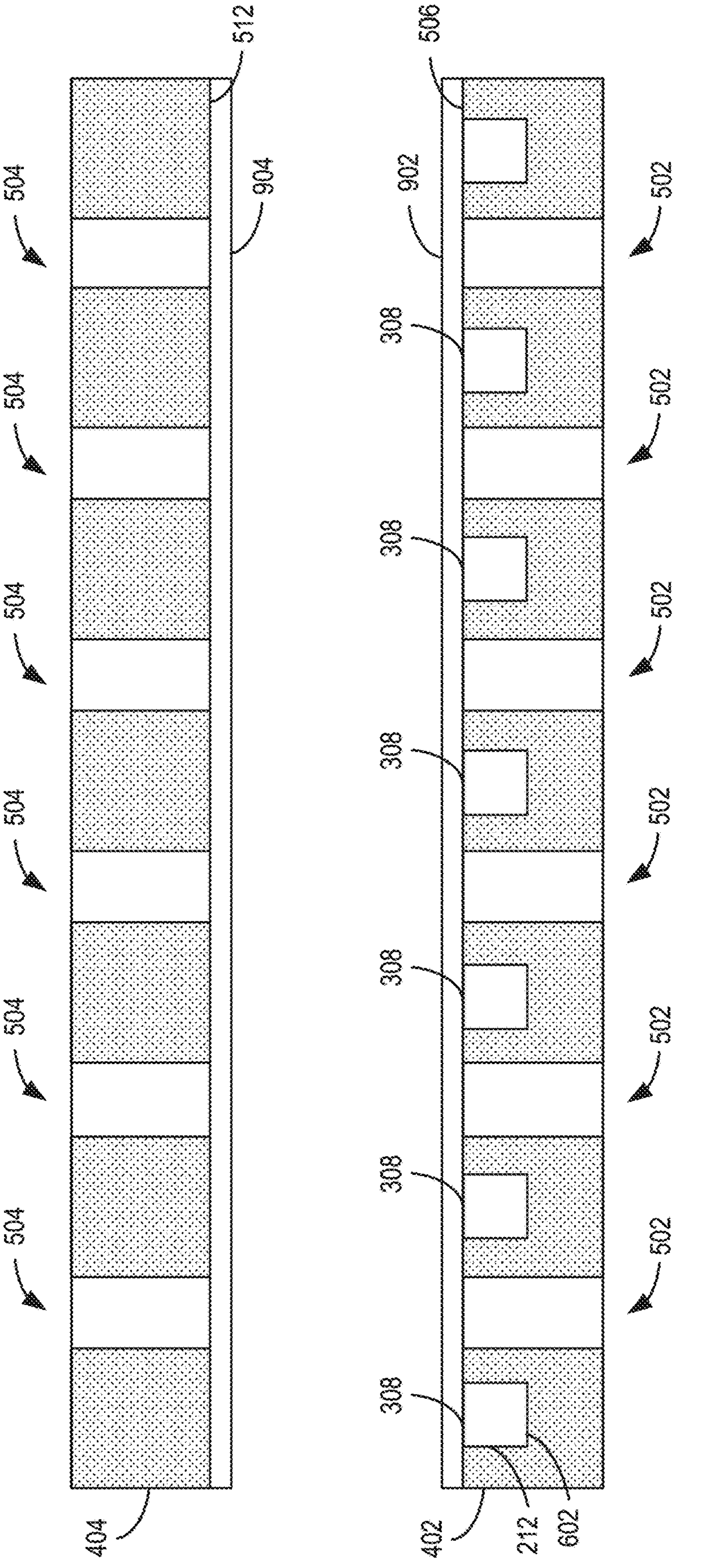
FIG. 9 illustrates example photo imageable dielectric (PID) layers provided on the first and second glass panels of FIG. 6.

FIG. 9 illustrates the first and second glass panels 402, 404 of FIG. 6 including example PID layers (e.g., bonding material) 902, 904 provided thereon. In some examples, after the first vias 502 and the trench 602 are provided in the first glass panel 402 (e.g., as described in connection with FIG. 6 above), the first PID layer 902 is provided (e.g., deposited, laminated, coated) on the first surface 506 of the first glass panel 402. In particular, the first PID layer 902 is coupled to the first surface 506 across the trench 602 and the first vias 502, where the trench 602 and the first PID layer 902 define the channel 212 of FIGS. 2, 3A, and/or 3B. In such examples, the first PID layer 902 seals the channel 212 to prevent and/or restrict leakage of fluid therefrom. Further, the second PID layer 904 is provided (e.g., deposited, laminated, coated) on the fourth surface 512 of the second glass panel 404 across the second vias 504. In some examples, the PID layers 902, 904 include a polymer material. In some examples, a thickness of the PID layers 902, 904 is less than a thickness of the first and second glass panels 402, 404.

Figure 10:
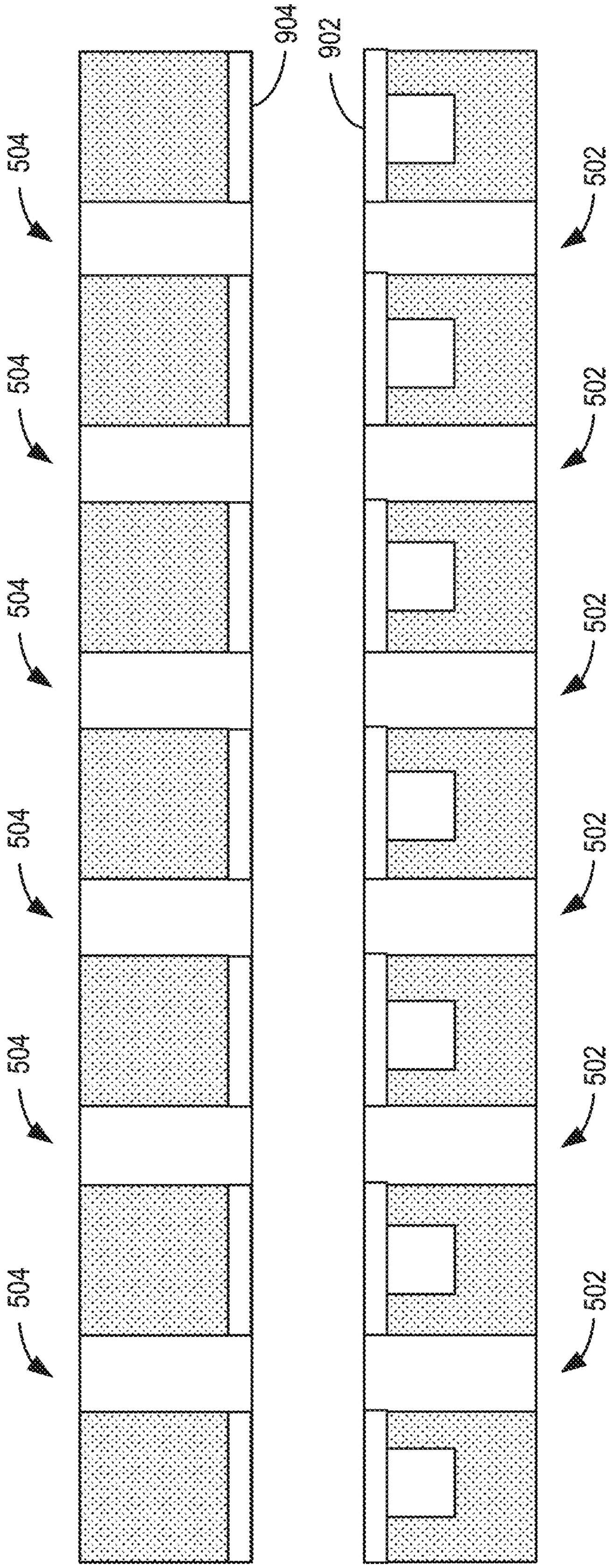
FIG. 10 illustrates the first and second example glass panels of FIG. 9 with portions of the example PID layers removed.

FIG. 10 illustrates the example first and second glass panels 402, 404 of FIG. 9 having portions of the PID layers 902, 904 removed. In the illustrated example of FIG. 10, portions of the first PID layer 902 corresponding to the first vias 502 are removed, and portions of the second PID layer 904 corresponding to the second vias 504 are removed. In some examples, the portions of the PID layers 902, 904 are removed by etching, drilling, machining, lasering, etc.

Figure 11:
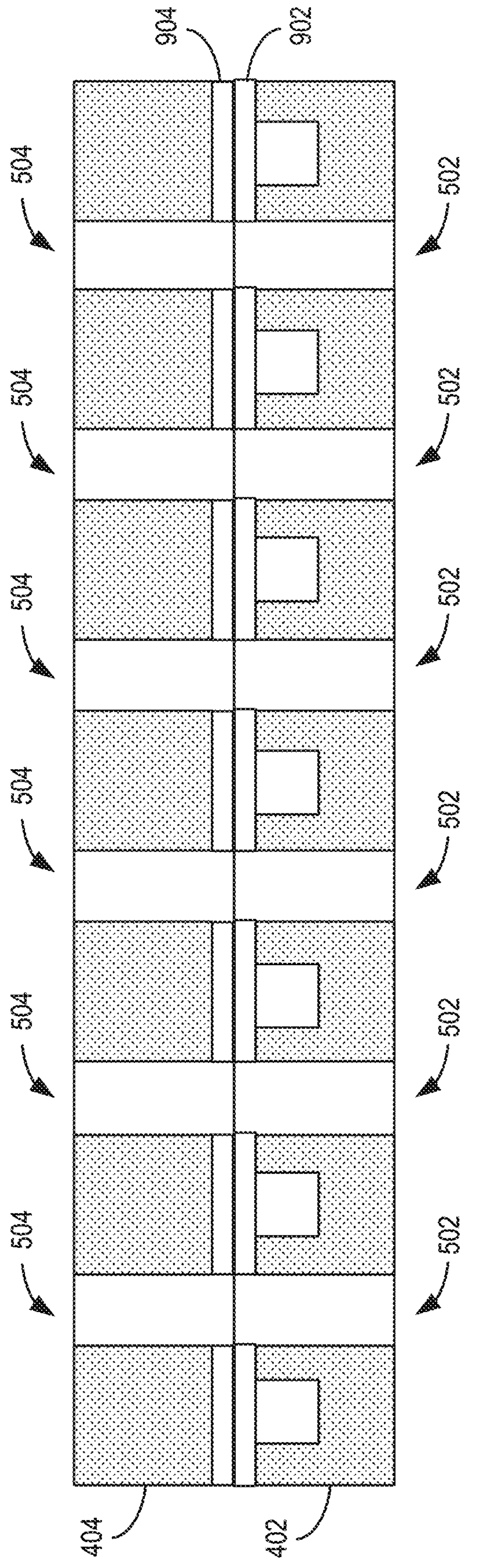
FIG. 11 illustrates the second glass panel coupled to first glass panel by coupling of the PID layers of FIG. 10.

FIG. 11 illustrates the second glass panel 404 coupled to the first glass panel 402 by coupling the PID layers 902, 904 of FIG. 10. In the illustrated example of FIG. 11, the first and second glass panels 402, 404 are positioned such that the first and second vias 502, 504 are substantially aligned and the first PID layer 902 abuts (e.g., contacts) the second PID layer 904. In some examples, after positioning of the first and second glass panels 402, 404, pressure and/or heat is applied to the first glass panel 402 and/or the second glass panel 404 to cause bonding and/or fusion of the first and second PID layers 902, 904. In some examples, PID-to-PID bonding of the first and second PID layers 902, 904 can be used to couple the first glass panel 402 to the second glass panel 404 (e.g., instead of the direct glass-to-glass bonding described in connection with FIG. 7 above). In some examples, coupling first and second glass panels 402, 404 using PID-to-PID bonding may result in fewer defects in the first and second glass panels 402, 404 compared to when direct glass-to-glass bonding is used.

Figure 12:
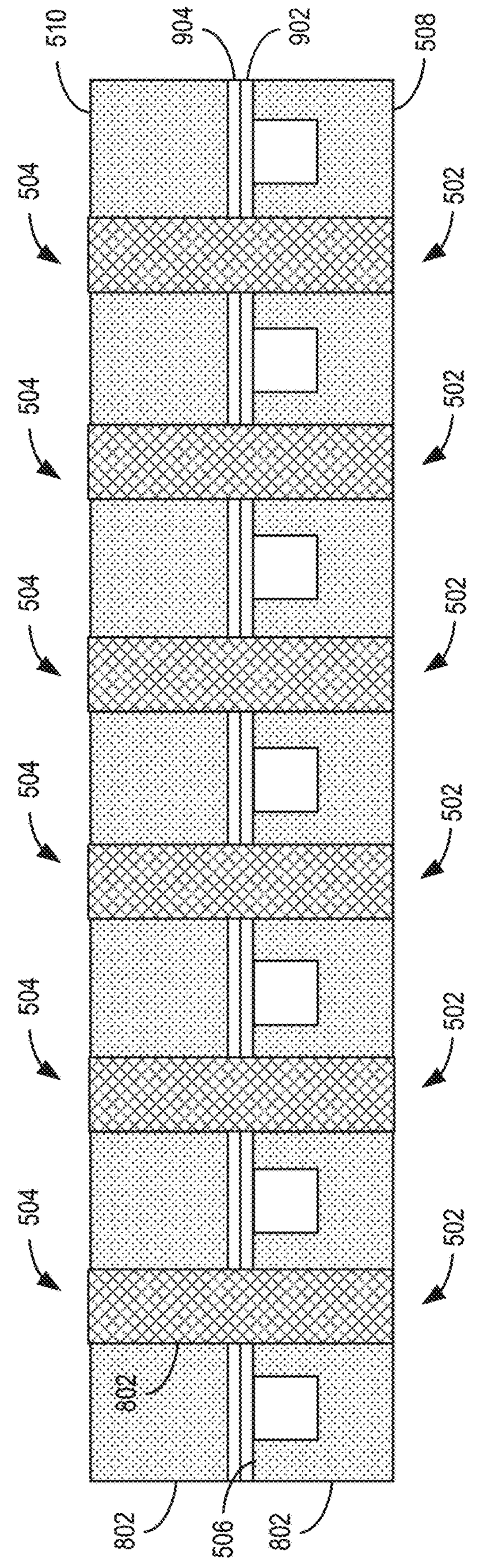
FIG. 12 illustrates example copper material provided in the first and second vias of the first and second glass panels of FIG. 11.

FIG. 12 illustrates the first and second glass panels 402, 404 of FIG. 11 with the example copper material 802 provided in the first and second vias 502, 504. As described in connection with FIG. 8 above, the copper material 802 provides electrical connections between electrical components (e.g., the dies 108, 108 and/or the circuit board 102 of FIG. 1) on opposite sides of the package substrate 110 of FIG. 2. In some examples, the first build-up layers 202 of FIG. 2 can be deposited on the third surface 510 of the second glass panel 404 and the second build-up layers 204 of FIG. 2 can be deposited on the second surface 508 of the first glass panel 402 to produce the package substrate 110 of FIG. 2. In some examples, the second glass panel 404 may be omitted from the package substrate 110. In such examples, the first PID layer 902 is provided on the first surface 506 of the first glass panel 402, and the first build-up layers 202 of FIG. 2 can be deposited directly on the first PID layer 902 (e.g., without an intervening glass layer) to produce the package substrate 110.

Figure 13:
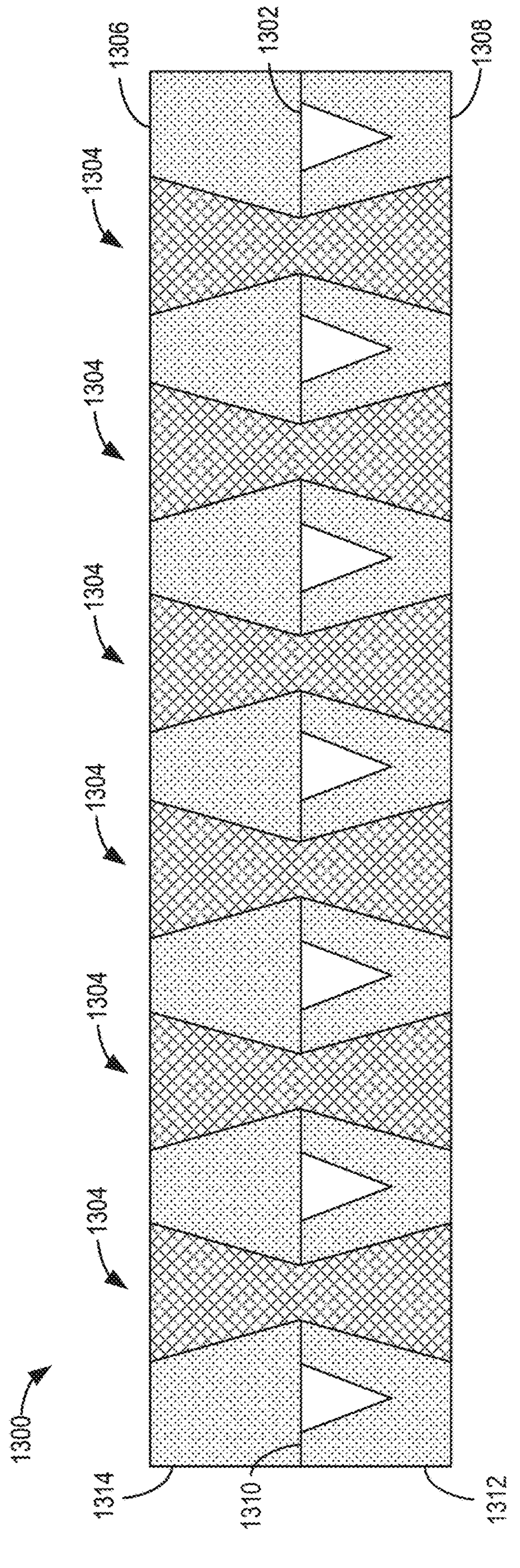
FIG. 13 illustrates a second example glass core that may be implemented in the example package substrate of FIG. 2.

FIG. 13 illustrates a second example glass core 1300 that may be implemented in the example package substrate 110 of FIG. 2. In the illustrated example of FIG. 13, the second glass core 1300 includes a second example channel 1302 and third example vias 1304 extending between first and second example surfaces 1306, 1308 of the second glass core 1300. Unlike the channel 212 shown in FIGS. 6-12 having a rectangular cross-sectional shape, the second channel 1302 shown in FIG. 13 has a triangular cross-sectional shape. Further, in contrast to the vias 502, 504 shown in FIGS. 5-12 having a cylindrical shape, the third vias 1304 shown in FIG. 13 have an hourglass shape. In particular, a cross-sectional diameter of the third vias 1304 decreases from the first surface 1306 to an example interface 1310 between first and second example glass panels 1312, 1314 of the second glass core 1300, and the cross-sectional diameter of the third vias 1304 increases from the interface 1310 to the second surface 1308.

In this example, the second glass core 1300 of FIG. 13 is produced using direct glass-to-glass bonding (e.g., as described in connection with FIGS. 4-8 above). In some examples, the second glass core 1300 can be produced using PID-to-PID bonding by providing one or more PID layers between the first and second glass panels 1312, 1314 (e.g., as described in connection with FIG. 912 above). In some examples, the one or more of the vias 502, 504 and/or the channel 212 of FIGS. 5-12 may be included in the second glass core 1300 in addition to or instead of one or more of the third vias 1304 and/or the second channel 1302 of FIG. 13.

Figure 14:
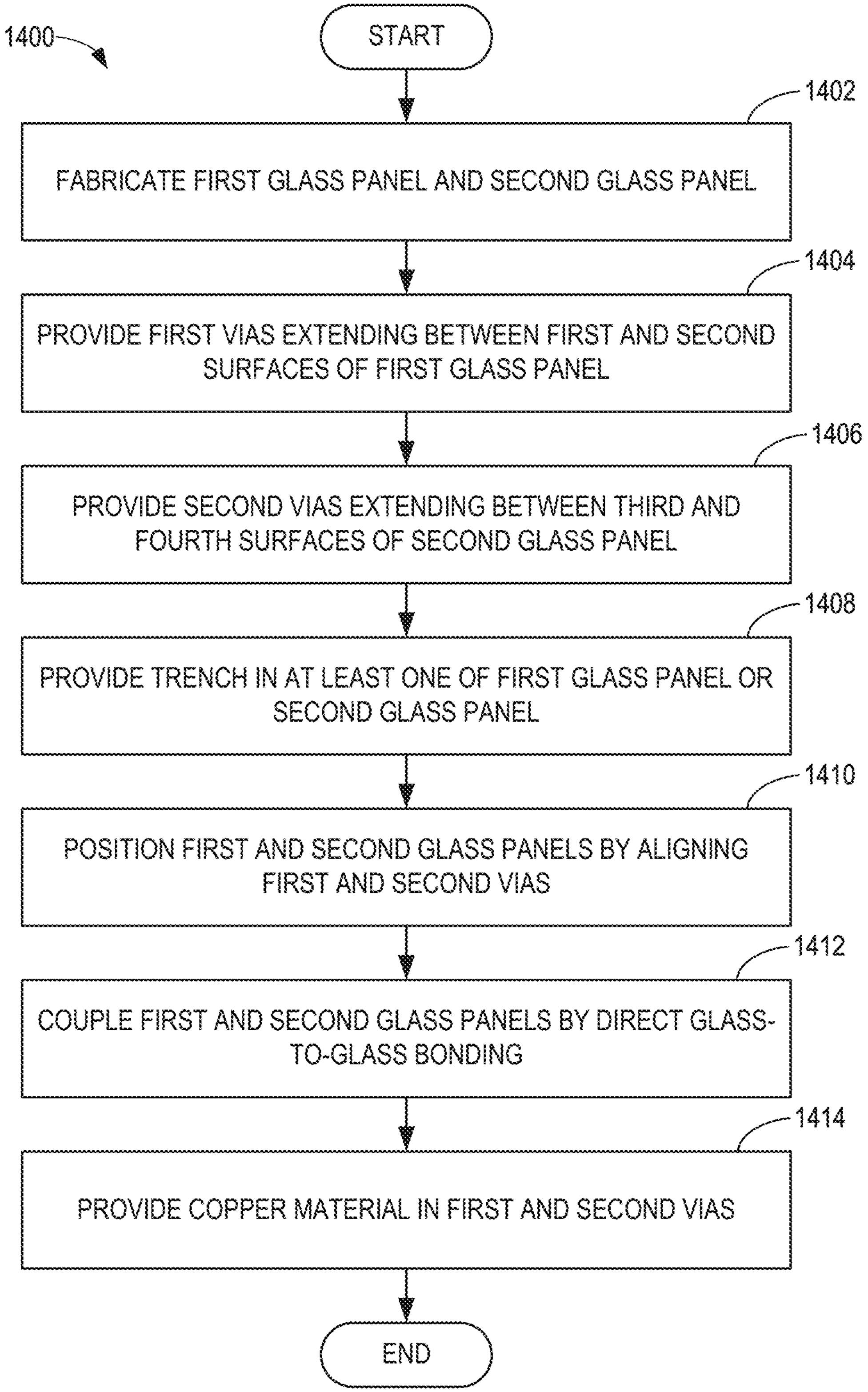
FIG. 14 is a flowchart representative of an example method of manufacturing the example glass core of FIGS. 2, 3A, and/or 3B using direct glass-to-glass bonding.

FIG. 14 is a flowchart representative of an example method 1400 of manufacturing the example glass core 206 of FIGS. 2, 3A, and/or 3B using direct glass-to-glass bonding. In some examples, some or all of the operations outlined in the example method 1400 are performed automatically by fabrication equipment that is programmed to perform the operations. Although the example method of manufacturing is described with reference to the flowchart illustrated in FIG. 14, many other methods may alternatively be used. For example, the order or execution of the blocks may be changed, and/or some of the blocks described may be combined, divided, re-arranged, omitted, eliminated, and/or implemented in any other way.

The example method 1400 of FIG. 14 begins at block 1402 by fabricating the first example glass panel 402 and the second example glass panel 404 of FIG. 4. In some examples, the first and second glass panels 402, 404 are fabricated to have a substantially similar size, shape, and/or thickness.

At block 1404, the example method 1400 includes providing the first example vias 502 in the first glass panel 402 to extend between the first and second example surfaces 506, 508 of the first glass panel 402 of FIG. 5. In some examples, the first vias 502 can be provided in the first glass panel 402 by drilling and/or etching of the first glass panel 402.

At block 1406, the example method 1400 includes providing the second example vias 504 in the second glass panel 404 to extend between the third and fourth example surfaces 510, 512 of the second glass panel 404. In some examples, the second vias 504 can be provided in the second glass panel 404 by drilling and/or etching of the second glass panel 404.

At block 1408, the example method 1400 includes providing the example trench 602 in at least one of the first glass panel 402 or the second glass panel 404. For example, the trench 602 is provided in the first surface 506 of the first glass panel 402 and extends into the first glass panel 402 by a distance less than a thickness of the first glass panel 402. Additionally or alternatively, the trench 602 may be provided in the fourth example surface 512 of the second glass panel 404.

At block 1410, the example method 1400 includes positioning the first and second glass panels 402, 404 by aligning the first and second vias 502, 504. For example, the first and second glass panels 402, 404 are positioned such that the first and second vias 502, 504 are substantially aligned, and the first surface 506 of the first glass panel 402 abuts (e.g., contacts) the fourth surface 512 of the second glass panel 404.

At block 1412, the example method 1400 includes coupling the first and second glass panels 402, 404 by direct glass-to-glass bonding. For example, pressure and/or heat is applied to at least one of the first glass panel 402 or the second glass panel 404 to bond the first and second glass panels 402, 404 at the example interface 702. In some examples, when the second glass panel 404 is coupled to the first glass panel 402, the trench 602 and the second glass panel 404 define the example channel 212.

At block 1414, the example method 1400 includes providing the example copper material 802 in the first and second vias 502, 504. For example, the copper material 802 is provided in the first and second vias 502, 504 to provide electrical connections between one or more electrical components on opposite sides of the glass core 206.

Figure 15:
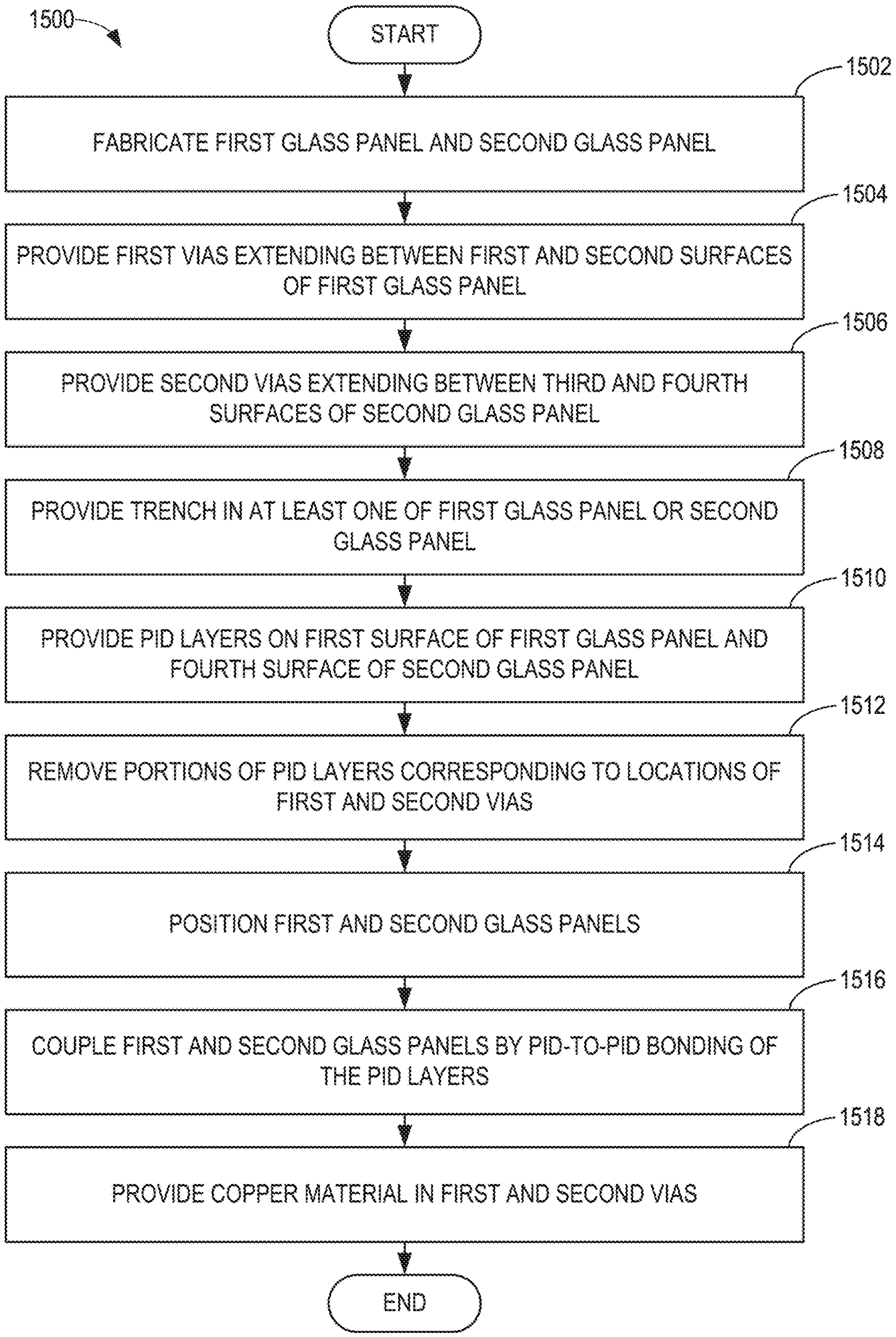
FIG. 15 is a flowchart representative of an example method of manufacturing the example glass core of FIGS. 2, 3A, and/or 3B using PID-to-PID bonding.

FIG. 15 is a flowchart representative of an example method 1500 of manufacturing the example glass core 206 of FIGS. 2, 3A, and/or 3B using PID-to-PID bonding. In some examples, some or all of the operations outlined in the example method 1500 are performed automatically by fabrication equipment that is programmed to perform the operations. Although the example method of manufacturing is described with reference to the flowchart illustrated in FIG. 15, many other methods may alternatively be used. For example, the order or execution of the blocks may be changed, and/or some of the blocks described may be combined, divided, re-arranged, omitted, eliminated, and/or implemented in any other way.

The example method 1500 of FIG. 15 begins at block 1502 by fabricating the first example glass panel 402 and the second example glass panel 404 of FIG. 4. In some examples, the first and second glass panels 402, 404 are fabricated to have a substantially similar size, shape, and/or thickness.

At block 1504, the example method 1500 includes providing the first example vias 502 in the first glass panel 402 to extend between the first and second example surfaces 506, 508 of the first glass panel 402 of FIG. 5. In some examples, the first vias 502 can be provided in the first glass panel 402 by drilling and/or etching of the first glass panel 402.

At block 1506, the example method 1500 includes providing the second example vias 504 in the second glass panel 404 to extend between the third and fourth example surfaces 510, 512 of the second glass panel 404. In some examples, the second vias 504 can be provided in the second glass panel 404 by drilling and/or etching of the second glass panel 404.

At block 1508, the example method 1500 includes providing the example trench 602 in at least one of the first glass panel 402 or the second glass panel 404. For example, the trench 602 is provided in the first surface 506 of the first glass panel 402 and extends into the first glass panel 402 by a distance less than a thickness of the first glass panel 402. Additionally or alternatively, the trench 602 may be provided in the fourth example surface 512 of the second glass panel 404.

At block 1510, the example method 1500 includes providing the example PID layers 902, 904 on the first surface 506 of the first glass panel 402 and the fourth surface 512 of the second glass panel 404. For example, the first PID layer 902 is coupled to (e.g., laminated on) the first surface 506 across the trench 602 and the first vias 502, and the second PID layer 904 is coupled to the fourth surface 512 across the second vias 504. In some examples, the trench 602 and the first PID layer 902 define the channel 212 of FIGS. 6-12.

At block 1512, the example method 1500 includes removing portions of the first and second PID layers 902, 904 corresponding to locations of the first and second vias 502. For example, the portions of the first and second PID layers 902, 904 can be removed by etching, lasering, drilling, etc.

At block 1514, the example method 1500 includes positioning the first and second glass panels 402, 404. For example, the first and second glass panels 402, 404 are positioned such that the first and second vias 502, 504 are substantially aligned, and the first PID layer 902 of the first glass panel 402 abuts (e.g., contacts) the second PID layer 904 of the second glass panel 404.

At block 1516, the example method 1500 includes coupling the first and second glass panels 402, 404 by PID-to-PID bonding. For example, pressure and/or heat is applied to at least one of the first glass panel 402 or the second glass panel 404 to bond the first and second PID layers 902, 904 and, thus, couple the first and second glass panels 402, 404.

At block 1518, the example method 1500 includes providing the example copper material 802 in the first and second vias 502, 504. For example, the copper material 802 is provided in the first and second vias 502, 504 to provide electrical connections between one or more electrical components on opposite sides of the glass core 206.

The example glass core 206 disclosed herein may be included in any suitable electronic component. FIGS. 16-20 illustrate various examples of apparatus that may include the glass core 206 disclosed herein.

Figure 16:
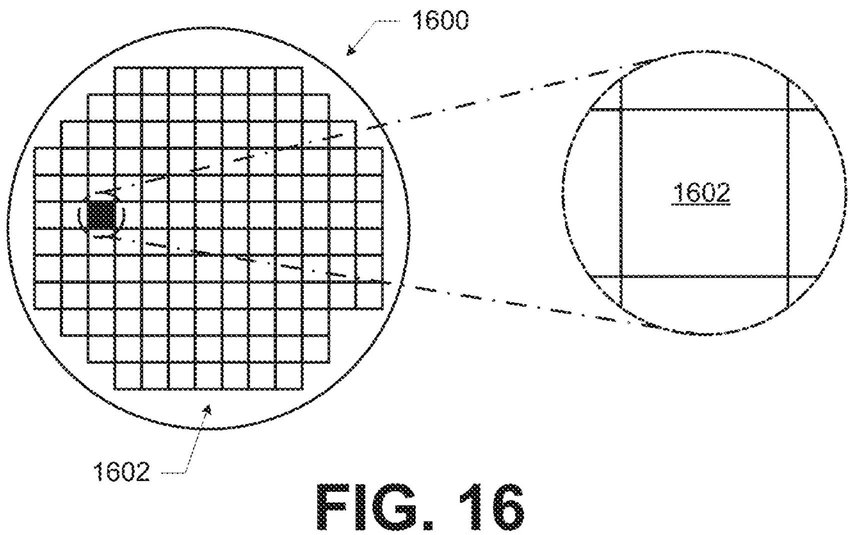
FIG. 16 is a top view of a wafer including dies that may be included in an IC package constructed in accordance with teachings disclosed herein.

FIG. 16 is a top view of a wafer 1600 and dies 1602 that may be included in an IC package whose substrate includes the glass core 206 in accordance with any of the examples disclosed herein. The wafer 1600 may be composed of semiconductor material and may include one or more dies 1602 having circuitry. Each of the dies 1602 may be a repeating unit of a semiconductor product. After the fabrication of the semiconductor product is complete, the wafer 1600 may undergo a singulation process in which the dies 1602 are separated from one another to provide discrete "chips." The die 1602 may include one or more transistors (e.g., some of the transistors 1740 of FIG. 17, discussed below), supporting circuitry to route electrical signals to the transistors, passive components (e.g., traces, resistors, capacitors, inductors, and/or other circuitry), and/or any other components. In some examples, the die 1602 may include and/or implement a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuitry. Multiple ones of these devices may be combined on a single die 1602. For example, a memory array formed by multiple memory circuits may be formed on a same die 1602 as programmable circuitry (e.g., the processor circuitry 2002 of FIG. 20) or other logic circuitry. Such memory circuitry may store information or instructions for use by the programmable circuitry. The example IC package 100 disclosed herein may be manufactured using a die-to-wafer assembly technique in which some dies are attached to a wafer 1600 that include others of the dies, and the wafer 1600 is subsequently singulated.

Figure 17:
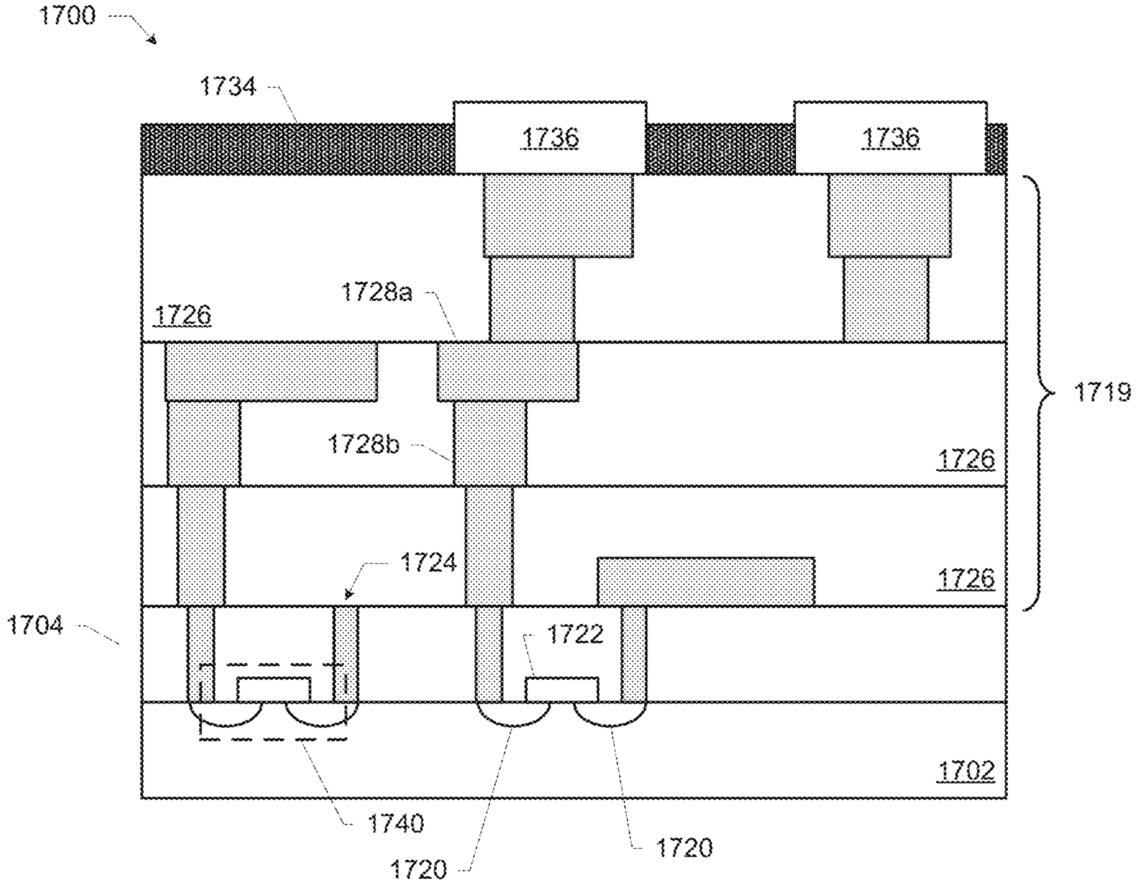
FIG. 17 is a cross-sectional side view of an IC device that may be included in an IC package constructed in accordance with teachings disclosed herein.

FIG. 17 is a cross-sectional side view of an IC device 1700 that may be included in an IC package whose substrate includes the glass core 206, in accordance with any of the examples disclosed herein. One or more of the IC devices 1700 may be included in one or more dies 1602 (FIG. 16). The IC device 1700 may be formed on a die substrate 1702 (e.g., the wafer 1600 of FIG. 16) and may be included in a die (e.g., the die 1602 of FIG. 16). The die substrate 1702 may be a semiconductor substrate composed of semiconductor material systems including, for example, n-type or p-type materials systems (or a combination of both). The die substrate 1702 may include, for example, a crystalline substrate formed using a bulk silicon or a silicon-on-insulator (SOI) substructure. In some examples, the die substrate 1702 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 1702. Although a few examples of materials from which the die substrate 1702 may be formed are described here, any material that may serve as a foundation for an IC device 1700 may be used. The die substrate 1702 may be part of a singulated die (e.g., the dies 1602 of FIG. 16) or a wafer (e.g., the wafer 1600 of FIG. 16).

The IC device 1700 may include one or more device layers 1704 disposed on or above the die substrate 1702. The device layer 1704 may include features of one or more transistors 1740 (e.g., metal oxide semiconductor field-effect transistors (MOSFETs)) formed on the die substrate 1702. The device layer 1704 may include, for example, one or more source and/or drain (S/D) regions 1720, a gate 1722 to control current flow between the S/D regions 1720, and one or more S/D contacts 1724 to route electrical signals to/from the S/D regions 1720. The transistors 1740 may include additional features not depicted for the sake of clarity, such as device isolation regions, gate contacts, and the like. The transistors 1740 are not limited to the type and configuration depicted in FIG. 17 and may include a wide variety of other types and/or configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1740 may include a gate 1722 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 1740 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 1740 along the source-channel-drain direction, the gate electrode may consist of a U-shaped structure that includes a bottom portion substantially parallel to the surface of the die substrate 1702 and two sidewall portions that are substantially perpendicular to the top surface of the die substrate 1702. In other examples, at least one of the metal layers that form the gate electrode may simply be a planar layer that is substantially parallel to the top surface of the die substrate 1702 and does not include sidewall portions substantially perpendicular to the top surface of the die substrate 1702. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 1720 may be formed within the die substrate 1702 adjacent to the gate 1722 of each transistor 1740. The S/D regions 1720 may be formed using an implantation/diffusion process or an etching/deposition process, for example. In the former process, dopants such as boron, aluminum, antimony, phosphorous, or arsenic may be ion-implanted into the die substrate 1702 to form the S/D regions 1720. An annealing process that activates the dopants and causes them to diffuse farther into the die substrate 1702 may follow the ion-implantation process. In the latter process, the die substrate 1702 may first be etched to form recesses at the locations of the S/D regions 1720. An epitaxial deposition process may then be carried out to fill the recesses with material that is used to fabricate the S/D regions 1720. In some implementations, the S/D regions 1720 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 1720 may be formed using one or more alternate semiconductor materials such as germanium or a group III-V material or alloy. In further examples, one or more layers of metal and/or metal alloys may be used to form the S/D regions 1720.

Electrical signals, such as power and/or input/output (I/O) signals, may be routed to and/or from the devices (e.g., transistors 1740) of the device layer 1704 through one or more interconnect layers disposed on the device layer 1704 (illustrated in FIG. 17 as interconnect layers 1706-2010). For example, electrically conductive features of the device layer 1704 (e.g., the gate 1722 and the S/D contacts 1724) may be electrically coupled with the interconnect structures 1728 of the interconnect layers 1706-2010. The one or more interconnect layers 1706-2010 may form a metallization stack (also referred to as an "ILD stack") 1719 of the IC device 1700.

The interconnect structures 1728 may be arranged within the interconnect layers 1706-2010 to route electrical signals according to a wide variety of designs (in particular, the arrangement is not limited to the particular configuration of interconnect structures 1728 depicted in FIG. 17). Although a particular number of interconnect layers 1706-2010 is depicted in FIG. 17, examples of the present disclosure include IC devices having more or fewer interconnect layers than depicted.

In some examples, the interconnect structures 1728 may include lines **1728*a* and/or vias 1728*b* filled with an electrically conductive material such as a metal. The lines 1728*a* may be arranged to route electrical signals in a direction of a plane that is substantially parallel with a surface of the die substrate 1702 upon which the device layer 1704 is formed. For example, the lines 1728*a* may route electrical signals in a direction in and out of the page from the perspective of FIG. 17. The vias 1728*b* may be arranged to route electrical signals in a direction of a plane that is substantially perpendicular to the surface of the die substrate 1702 upon which the device layer 1704 is formed. In some examples, the vias 1728*b* may electrically couple lines 1728*a* of different interconnect layers 1706-2010** together.

The interconnect layers 1706-2010 may include a dielectric material 1726 disposed between the interconnect structures 1728, as shown in FIG. 17. In some examples, the dielectric material 1726 disposed between the interconnect structures 1728 in different ones of the interconnect layers 1706-2010 may have different compositions; in other examples, the composition of the dielectric material 1726 between different interconnect layers 1706-2010 may be the same.

A first interconnect layer 1706 (referred to as Metal 1 or "M1") may be formed directly on the device layer 1704. In some examples, the first interconnect layer 1706 may include lines **1728*a* and/or vias 1728*b*, as shown. The lines 1728*a* of the first interconnect layer 1706 may be coupled with contacts (e.g., the S/D contacts 1724) of the device layer 1704**.

A second interconnect layer 1708 (referred to as Metal 2 or "M2") may be formed directly on the first interconnect layer 1706. In some examples, the second interconnect layer 1708 may include vias **1728*b* to couple the lines 1728*a* of the second interconnect layer 1708 with the lines 1728*a* of the first interconnect layer 1706. Although the lines 1728*a* and the vias 1728*b* are structurally delineated with a line within each interconnect layer (e.g., within the second interconnect layer 1708) for the sake of clarity, the lines 1728*a* and the vias 1728*b*** may be structurally and/or materially contiguous (e.g., simultaneously filled during a dual-damascene process) in some examples.

A third interconnect layer 1710 (referred to as Metal 3 or "M3") (and additional interconnect layers, as desired) may be formed in succession on the second interconnect layer 1708 according to similar techniques and configurations described in connection with the second interconnect layer 1708 or the first interconnect layer 1706. In some examples, the interconnect layers that are "higher up" in the metallization stack 1719 in the IC device 1700 (i.e., further away from the device layer 1704) may be thicker.

The IC device 1700 may include a solder resist material 1734 (e.g., polyimide or similar material) and one or more conductive contacts 1736 formed on the interconnect layers 1706-2010. In FIG. 17, the conductive contacts 1736 are illustrated as taking the form of bond pads. The conductive contacts 1736 may be electrically coupled with the interconnect structures 1728 and configured to route the electrical signals of the transistor(s) 1740 to other external devices. For example, solder bonds may be formed on the one or more conductive contacts 1736 to mechanically and/or electrically couple a chip including the IC device 1700 with another component (e.g., a circuit board). The IC device 1700 may include additional or alternate structures to route the electrical signals from the interconnect layers 1706-2010; for example, the conductive contacts 1736 may include other analogous features (e.g., posts) that route the electrical signals to external components.

Figure 18:
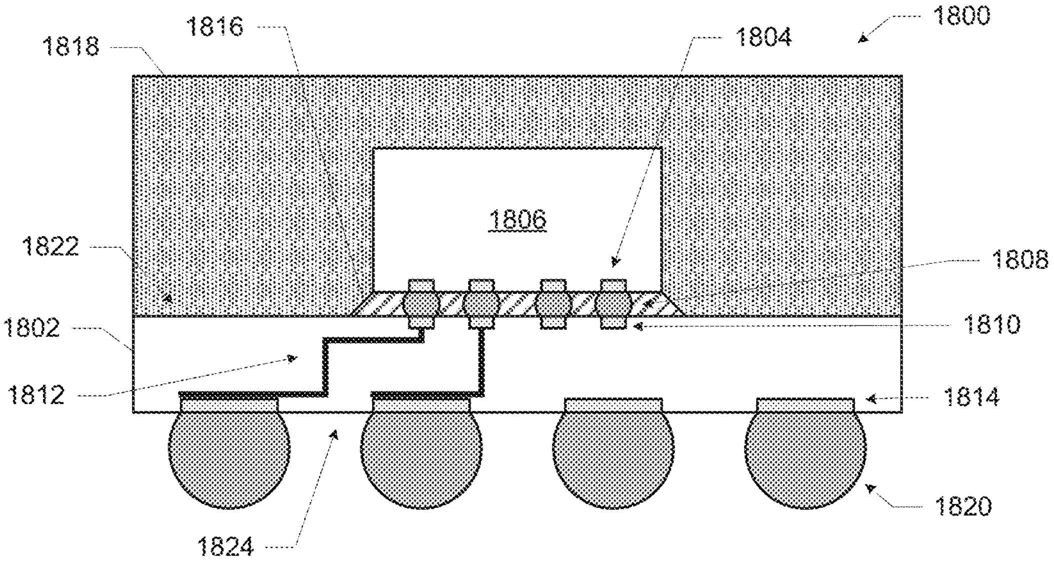
FIG. 18 is a cross-sectional side view of an IC package that may include an example glass core, in accordance with various examples.

FIG. 18 is a cross-sectional view of an example IC package 1800 that may include the glass core 206. The package substrate 1802 may be formed of a dielectric material, and may have conductive pathways extending through the dielectric material between upper and lower faces 1822, 1824, or between different locations on the upper face 1822, and/or between different locations on the lower face 1824. These conductive pathways may take the form of any of the interconnects 1728 discussed above with reference to FIG. 17. In some examples, any number of the glass core 206 (with any suitable structure) may be included in a package substrate 1802. In some examples, no glass core 206 may be included in the package substrate 1802.

The IC package 1800 may include a die 1806 coupled to the package substrate 1802 via conductive contacts 1804 of the die 1806, first-level interconnects 1808, and conductive contacts 1810 of the package substrate 1802. The conductive contacts 1810 may be coupled to conductive pathways 1812 through the package substrate 1802, allowing circuitry within the die 1806 to electrically couple to various ones of the conductive contacts 1814 or to the glass core 206 (or to other devices included in the package substrate 1802, not shown). The first-level interconnects 1808 illustrated in FIG. 18 are solder bumps, but any suitable first-level interconnects 1808 may be used. As used herein, a "conductive contact" refers to a portion of conductive material (e.g., metal) serving as an electrical interface between different components. Conductive contacts may be recessed in, flush with, or extending away from a surface of a component, and may take any suitable form (e.g., a conductive pad or socket).

In some examples, an underfill material 1816 may be disposed between the die 1806 and the package substrate 1802 around the first-level interconnects 1808, and a mold compound 1818 may be disposed around the die 1806 and in contact with the package substrate 1802. In some examples, the underfill material 1816 may be the same as the mold compound 1818. Example materials that may be used for the underfill material 1816 and the mold compound 1818 are epoxy mold materials, as suitable. Second-level interconnects 1820 may be coupled to the conductive contacts 1814. The second-level interconnects 1820 illustrated in FIG. 18 are solder balls (e.g., for a ball grid array arrangement), but any suitable second-level interconnects 1820 may be used (e.g., pins in a pin grid array arrangement or lands in a land grid array arrangement). The second-level interconnects 1820 may be used to couple the IC package 1800 to another component, such as a circuit board (e.g., a motherboard), an interposer, or another IC package, as known in the art and as discussed below with reference to FIG. 19.

In FIG. 18, the IC package 1800 is a flip chip package, and includes a glass core 206 in the package substrate 1802. The number and location of the glass core 206 in the package substrate 1802 of the IC package 1800 is simply illustrative, and any number of the glass core 206 (with any suitable structure) may be included in a package substrate 1802. In some examples, no glass core 206 may be included in the package substrate 1802. The die 1806 may take the form of any of the examples of the die 2002 discussed herein (e.g., may include any of the examples of the IC device 1700).

Although the IC package 1800 illustrated in FIG. 18 is a flip chip package, other package architectures may be used. For example, the IC package 1800 may be a ball grid array (BGA) package, such as an embedded wafer-level ball grid array (eWLB) package. In another example, the IC package 1800 may be a wafer-level chip scale package (WLCSP) or a panel fanout (FO) package. Although a single die 1806 is illustrated in the IC package 1800 of FIG. 18, an IC package 1800 may include multiple dies 1806. An IC package 1800 may include additional passive components, such as surface-mount resistors, capacitors, and inductors disposed on the first face 1822 or the second face 1824 of the package substrate 1802. More generally, an IC package 1800 may include any other active or passive components known in the art.

Figure 19:
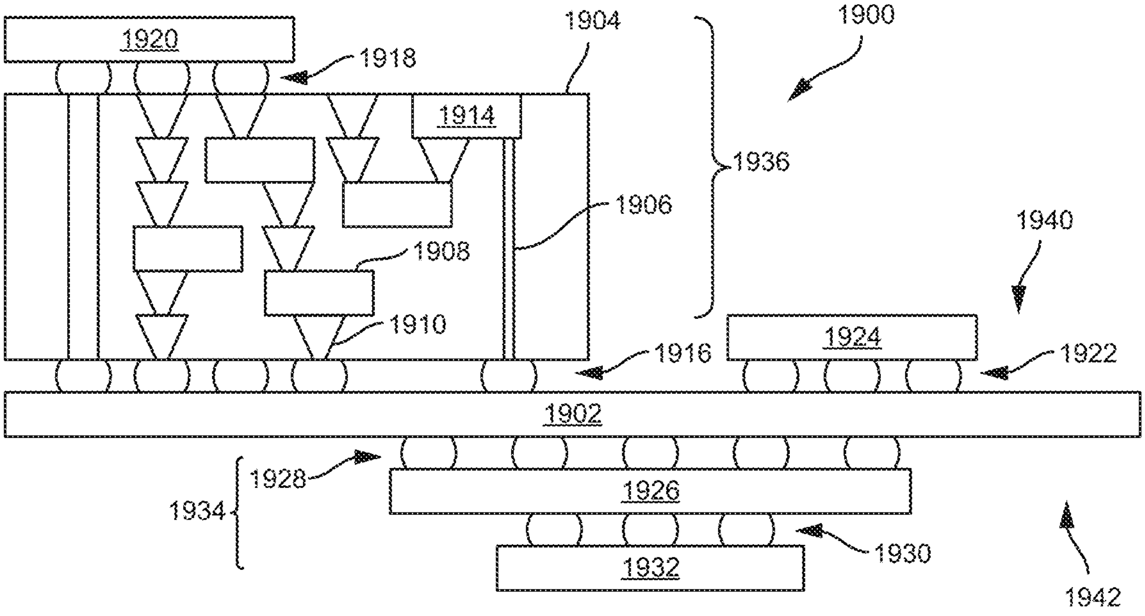
FIG. 19 is a cross-sectional side view of an IC device assembly that may include an IC package constructed in accordance with teachings disclosed herein.

FIG. 19 is a cross-sectional side view of an IC device assembly 1900 that may include the glass core 206 disclosed herein. The IC device assembly 1900 includes a number of components disposed on a circuit board 1902 (which may be, for example, a motherboard). The IC device assembly 1900 includes components disposed on a first face 1940 of the circuit board 1902 and an opposing second face 1942 of the circuit board 1902; generally, components may be disposed on one or both faces 1940 and 1942.

In some examples, the circuit board 1902 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1902. In other examples, the circuit board 1902 may be a non-PCB substrate.

The IC device assembly 1900 illustrated in FIG. 19 includes a package-on-interposer structure 1936 coupled to the first face 1940 of the circuit board 1902 by coupling components 1916. The coupling components 1916 may electrically and mechanically couple the package-on-interposer structure 1936 to the circuit board 1902, and may include solder balls (as shown in FIG. 19), male and female portions of a socket, an adhesive, an underfill material, and/or any other suitable electrical and/or mechanical coupling structure.

The package-on-interposer structure 1936 may include an IC package 1920 coupled to an interposer 1904 by coupling components 1918. The coupling components 1918 may take any suitable form for the application, such as the forms discussed above with reference to the coupling components 1916. Although a single IC package 1920 is shown in FIG. 19, multiple IC packages may be coupled to the interposer 1904; indeed, additional interposers may be coupled to the interposer 1904. The interposer 1904 may provide an intervening substrate used to bridge the circuit board 1902 and the IC package 1920. The IC package 1920 may be or include, for example, a die (the die 1602 of FIG. 16), an IC device (e.g., the IC device 1700 of FIG. 17), or any other suitable component. Generally, the interposer 1904 may spread a connection to a wider pitch or reroute a connection to a different connection. For example, the interposer 1904 may couple the IC package 1920 (e.g., a die) to a set of BGA conductive contacts of the coupling components 1916 for coupling to the circuit board 1902. In the example illustrated in FIG. 19, the IC package 1920 and the circuit board 1902 are attached to opposing sides of the interposer 1904; in other examples, the IC package 1920 and the circuit board 1902 may be attached to a same side of the interposer 1904. In some examples, three or more components may be interconnected by way of the interposer 1904.

In some examples, the interposer 1904 may be formed as a PCB, including multiple metal layers separated from one another by layers of dielectric material and interconnected by electrically conductive vias. In some examples, the interposer 1904 may be formed of an epoxy resin, a fiberglass-reinforced epoxy resin, an epoxy resin with inorganic fillers, a ceramic material, or a polymer material such as polyimide. In some examples, the interposer 1904 may be formed of alternate rigid or flexible materials that may include the same materials described above for use in a semiconductor substrate, such as silicon, germanium, and other group III-V and group IV materials. The interposer 1904 may include metal interconnects 1908 and vias 1910, including but not limited to through-silicon vias (TSVs) 1906. The interposer 1904 may further include embedded devices 1914, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1904. The package-on-interposer structure 1936 may take the form of any of the package-on-interposer structures known in the art.

The IC device assembly 1900 may include an IC package 1924 coupled to the first face 1940 of the circuit board 1902 by coupling components 1922. The coupling components 1922 may take the form of any of the examples discussed above with reference to the coupling components 1916, and the IC package 1924 may take the form of any of the examples discussed above with reference to the IC package 1920.

The IC device assembly 1900 illustrated in FIG. 19 includes a package-on-package structure 1934 coupled to the second face 1942 of the circuit board 1902 by coupling components 1928. The package-on-package structure 1934 may include a first IC package 1926 and a second IC package 1932 coupled together by coupling components 1930 such that the first IC package 1926 is disposed between the circuit board 1902 and the second IC package 1932. The coupling components 1928, 1930 may take the form of any of the examples of the coupling components 1916 discussed above, and the IC packages 1926, 1932 may take the form of any of the examples of the IC package 1920 discussed above. The package-on-package structure 1934 may be configured in accordance with any of the package-on-package structures known in the art.

Figure 20:
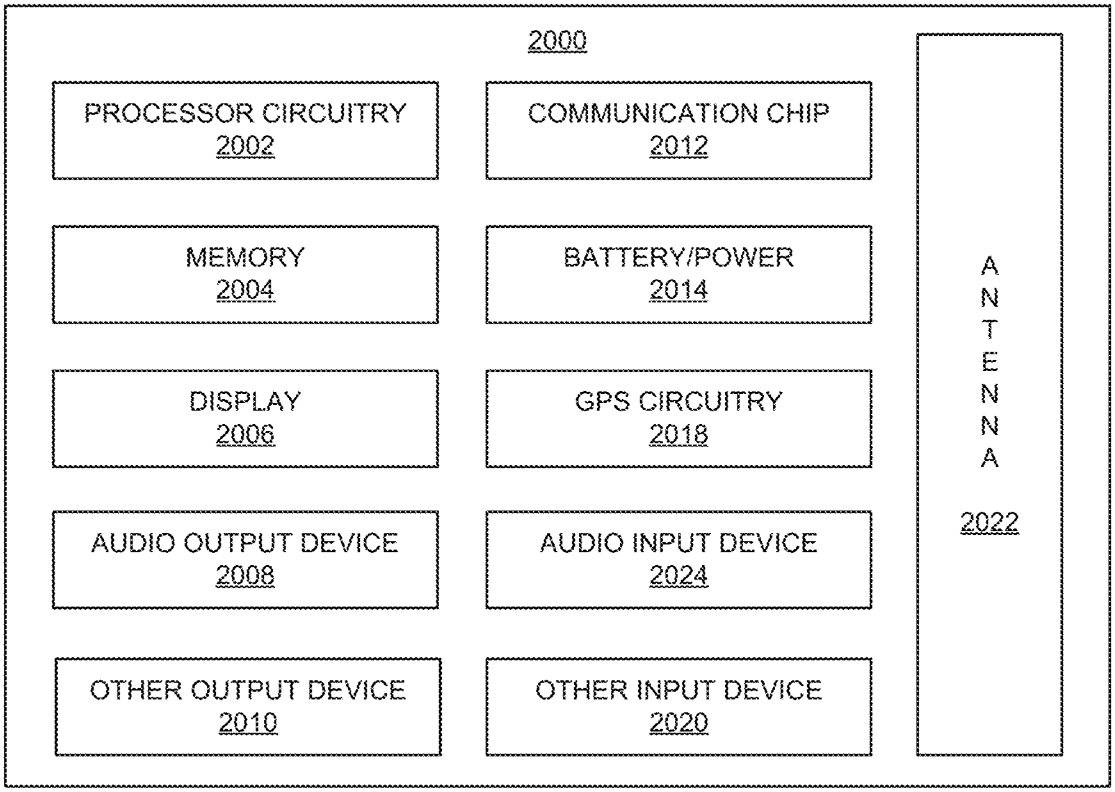
FIG. 20 is a block diagram of an example electrical device that may include an IC package constructed in accordance with teachings disclosed herein.

FIG. 20 is a block diagram of an example electrical device 2000 that may include the example glass core 206. For example, any suitable ones of the components of the electrical device 2000 may include one or more of the device assemblies 1900, IC devices 1700, or dies 1602 disclosed herein. A number of components are illustrated in FIG. 20 as included in the electrical device 2000, but any one or more of these components may be omitted or duplicated, as suitable for the application. In some examples, some or all of the components included in the electrical device 2000 may be attached to one or more motherboards. In some examples, some or all of these components are fabricated onto a single system-on-a-chip (SoC) die.

Additionally, in various examples, the electrical device 2000 may not include one or more of the components illustrated in FIG. 20, but the electrical device 2000 may include interface circuitry for coupling to the one or more components. For example, the electrical device 2000 may not include a display 2006, but may include display interface circuitry (e.g., a connector and driver circuitry) to which a display 2006 may be coupled. In another set of examples, the electrical device 2000 may not include an audio input device 2024 (e.g., microphone) or an audio output device 2008 (e.g., a speaker, a headset, earbuds, etc.), but may include audio input or output device interface circuitry (e.g., connectors and supporting circuitry) to which an audio input device 2024 or audio output device 2008 may be coupled.

The electrical device 2000 may include programmable circuitry 2002 (e.g., one or more processing devices). The programmablecircuitry 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 2004 may include memory that shares a die with the programmable-circuitry 2002. This memory may be used as cache memory and may include embedded dynamic random access memory (eDRAM) or spin transfer torque magnetic random access memory (STT-MRAM).

In some examples, the electrical device 2000 may include a communication chip 2012 (e.g., one or more communication chips). For example, the communication chip 2012 may be configured for managing wireless communications for the transfer of data to and from the electrical device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other examples. The electrical device 2000 may include an antenna 2022 to facilitate wireless communications and/or to receive other wireless communications (such as AM or FM radio transmissions).

In some examples, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some examples, a first communication chip 2012 may be dedicated to wireless communications, and a second communication chip 2012 may be dedicated to wired communications.

The electrical device 2000 may include battery/power circuitry 2014. The battery/power circuitry 2014 may include one or more energy storage devices (e.g., batteries or capacitors) and/or circuitry for coupling components of the electrical device 2000 to an energy source separate from the electrical device 2000 (e.g., AC line power).

The electrical device 2000 may include a display 2006 (or corresponding interface circuitry, as discussed above). The display 2006 may include any visual indicators, such as a heads-up display, a computer monitor, a projector, a touchscreen display, a liquid crystal display (LCD), a light-emitting diode display, or a flat panel display.

The electrical device 2000 may include an audio output device 2008 (or corresponding interface circuitry, as discussed above). The audio output device 2008 may include any device that generates an audible indicator, such as speakers, headsets, or earbuds.

The electrical device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The electrical device 2000 may include a GPS circuitry 2018. The GPS circuitry 2018 may be in communication with a satellite-based system and may receive a location of the electrical device 2000, as known in the art.

The electrical device 2000 may include any other output device 2010 (or corresponding interface circuitry, as discussed above). Examples of the other output device 2010 may include an audio codec, a video codec, a printer, a wired or wireless transmitter for providing information to other devices, or an additional storage device.

The electrical device 2000 may include any other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2000 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 2000 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that enable cooling of an IC package by providing cooling fluid to a glass core of a package substrate. Disclosed systems, methods, apparatus, and articles of manufacture produce an example glass core include an example channel (e.g., a microchannel) extending between a fluid inlet and a fluid outlet of the glass core. The channel is to receive the cooling fluid (e.g., air, water, oil, etc.) to flow from the fluid inlet to the fluid outlet, and heat is transferred from one or more electronic components of the IC package to the cooling fluid, thus reducing a temperature of the electronic components. Unlike some traditional cooling systems (e.g., heatsinks and/or liquid cooling systems) commonly used in IC packages, examples disclosed herein provide cooling on a substrate-side of the electronic components. As a result, examples disclosed herein can improve efficiency of heat transfer compared to when such traditional cooling systems are used alone. Accordingly, disclosed systems, methods, apparatus, and articles of manufacture improve the efficiency of using a computing device by efficiently cooling electronic components in an IC package, thus improving the operation of a machine by preventing the electronic components from overheating. Disclosed systems, methods, apparatus, and articles of manufacture are accordingly directed to one or more improvement(s) in the operation of a machine such as a computer or other electronic and/or mechanical device.

Example methods, apparatus, systems, and articles of manufacture to cool integrated circuit packages having glass substrates are disclosed herein. Further examples and combinations thereof include the following:

Example 1 includes an integrated circuit (IC) package, comprising a glass core including a via, the via extending between a first surface and a second surface of the glass core, and a channel to extend between a fluid inlet and a fluid outlet of the glass core, the channel to receive a cooling fluid to flow through the channel, the channel fluidly isolated from the via.

Example 2 includes the IC package of example 1, wherein the glass core includes a first glass substrate coupled to a second glass substrate, the channel provided in a first surface of the first glass substrate, the second glass substrate coupled to the first surface to seal the channel at an interface between the first and second glass substrates.

Example 3 includes the IC package of example 2, further including a photo imageable dielectric (PID) layer at the interface between the first and second glass substrates.

Example 4 includes the IC package of example 1, wherein the fluid inlet and the fluid outlet are on opposite sides of the glass core.

Example 5 includes the IC package of example 1, wherein the fluid inlet and the fluid outlet are on a same side of the glass core.

Example 6 includes the IC package of example 1, wherein the channel has a rectangular cross-sectional shape.

Example 7 includes the IC package of example 1, wherein a width of the channel is between 50 microns and 500 microns.

Example 8 includes the IC package of example 1, wherein the via has an hourglass shape and the channel has a triangular cross-sectional shape.

Example 9 includes the IC package of example 1, wherein the channel includes a first number of passages in a first region of the glass core and a second number of passages in a second region of the glass core, the first number of passages greater than the second number of passages.

Example 10 includes the IC package of example 9, further including a semiconductor chip coupled to build-up layers disposed on the glass core proximate the first region.

Example 11 includes a glass core of an integrated circuit (IC) package substrate, the glass core comprising a first glass panel having a first surface and a second surface, a channel in the first surface, the channel to extend into the first glass panel by a distance less than a thickness of the first glass panel, the channel to receive cooling fluid to flow through the channel between a fluid inlet and a fluid outlet of the first glass panel, and a second glass panel coupled to the first surface of the first glass panel, the second glass panel to seal the channel at an interface between the first and second glass panels.

Example 12 includes the glass core of example 11, wherein there is no bonding material between the first and second glass panels.

Example 13 includes the glass core of example 11, further including a photo imageable dielectric (PID) material between the first and second glass panels at the interface.

Example 14 includes the glass core of example 11, further including a first via extending between the first and second surfaces of the first glass panel and a second via extending between third and fourth surfaces of the second glass panel, the first via substantially aligned with the second via.

Example 15 includes the glass core of example 14, wherein the channel is fluidly isolated from the first and second vias.

Example 16 includes the glass core of example 14, further including copper material in the first and second vias.

Example 17 includes a method to produce a glass core of a semiconductor die, the method comprising providing a trench in a first surface of a first glass substrate, the trench extending into the first glass substrate by a distance less than a thickness of the first glass substrate, and coupling a second glass substrate to the first surface of the first glass substrate across the trench, the trench and the second glass substrate to define a channel, the channel to receive cooling fluid to flow through the channel between a fluid inlet and a fluid outlet of the first glass substrate.

Example 18 includes the method of example 17, further including coupling the second glass substrate to the first surface of the first glass substrate by direct glass-to-glass bonding.

Example 19 includes the method of example 17, further including providing a photo imageable dielectric (PID) layer at an interface between the first and second glass substrates.

Example 20 includes the method of example 19, further including removing portions of the PID layer corresponding to locations of vias in the first and second glass substrates.

Example 21 includes the method of example 17, further including providing first vias between the first surface and a second surface of the first glass substrate, providing second vias between a third surface and a fourth surface of the second glass substrate, and substantially aligning the first and second vias.

Example 22 includes the method of example 21, further including providing copper plating in the first and second vias.

Example 23 includes a glass core of an integrated circuit (IC) package substrate, the glass core comprising a fluid inlet to receive a cooling fluid, a fluid outlet, and a channel to fluidly couple the fluid inlet to the fluid outlet, the cooling fluid to flow through the channel from the fluid inlet to the fluid outlet, the channel fluidly isolated from one or more vias extending between a first surface and a second surface of the glass core.

Example 24 includes the glass core of example 23, wherein a width of the channel is between 50 microns and 500 microns.

Example 25 includes the glass core of example 23, wherein the one or more vias have an hourglass shape and the channel has a triangular cross-sectional shape.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An integrated circuit (IC) package, comprising:

a glass core including a via, the via extending between a first surface and a second surface of the glass core; and a channel to extend between a fluid inlet and a fluid outlet of the glass core, the channel to receive a cooling fluid to flow through the channel, the channel fluidly isolated from the via, the channel including a first number of passages in a first region of the glass core and a second number of passages in a second region of the glass core, the first number of passages greater than the second number of passages.

2. The IC package of claim 1, wherein the glass core includes a first glass substrate coupled to a second glass substrate, the channel in a first surface of the first glass substrate, the second glass substrate coupled to the first surface to seal the channel at an interface between the first and second glass substrates.

3. The IC package of claim 1, wherein the fluid inlet and the fluid outlet are on opposite sides of the glass core.

4. The IC package of claim 1, wherein the fluid inlet and the fluid outlet are on a same side of the glass core.

5. The IC package of claim 1, wherein the channel has a rectangular cross-sectional shape.

6. The IC package of claim 1, wherein a width of the channel is between 50 microns and 500 microns.

7. The IC package of claim 1, further including a semiconductor chip coupled to build-up layers on the glass core proximate the first region.

8. An integrated circuit (IC) package, comprising:

a glass core including a via and a first glass substrate coupled to a second glass substrate, the via extending between a first surface and a second surface of the glass core;

a channel to extend between a fluid inlet and a fluid outlet of the glass core, the channel in a first surface of the first glass substrate, the channel to receive a cooling fluid to flow through the channel, the second glass substrate coupled to the first surface to seal the channel at an interface between the first and second glass substrates, the channel fluidly isolated from the via; and a photo imageable dielectric (PID) layer at the interface between the first and second glass substrates.

9. An integrated circuit (IC) package, comprising:

a glass core including a via, the via extending between a first surface and a second surface of the glass core, the via having an hourglass shape; and a channel to extend between a fluid inlet and a fluid outlet of the glass core, the channel to receive a cooling fluid to flow through the channel, the channel fluidly isolated from the via, the channel having a triangular cross-sectional shape.

10. A glass core of an integrated circuit (IC) package substrate, the glass core comprising:

a first glass panel having a first surface and a second surface, a channel in the first surface, the channel to extend into the first glass panel by a distance less than a thickness of the first glass panel, the channel to receive cooling fluid to flow through the channel between a fluid inlet and a fluid outlet of the first glass panel;

a second glass panel coupled to the first surface of the first glass panel, the second glass panel to seal the channel at an interface between the first and second glass panels;

a first via extending between the first and second surfaces of the first glass panel; and a second via extending between third and fourth surfaces of the second glass panel, the first via substantially aligned with the second via.

11. The glass core of claim 10, wherein there is no bonding material between the first and second glass panels.

12. The glass core of claim 10, wherein the channel is fluidly isolated from the first and second vias.

13. The glass core of claim 10, including copper material in the first and second vias.

14. A glass core of an integrated circuit (IC) package substrate, the glass core comprising:

a first glass panel having a first surface and a second surface, a channel in the first surface, the channel to extend into the first glass panel by a distance less than a thickness of the first glass panel, the channel to receive cooling fluid to flow through the channel between a fluid inlet and a fluid outlet of the first glass panel;

a second glass panel coupled to the first surface of the first glass panel, the second glass panel to seal the channel at an interface between the first and second glass panels; and a photo imageable dielectric (PID) material between the first and second glass panels at the interface.

15. A method to produce a glass core of a semiconductor die, the method comprising:

providing a trench in a first surface of a first glass substrate, the trench extending into the first glass substrate by a distance less than a thickness of the first glass substrate;

coupling a second glass substrate to the first surface of the first glass substrate across the trench, the trench and the second glass substrate to define a channel, the channel to receive cooling fluid to flow through the channel between a fluid inlet and a fluid outlet of the first glass substrate;

providing first vias between the first surface and a second surface of the first glass substrate;

providing second vias between a third surface and a fourth surface of the second glass substrate; and substantially aligning the first and second vias.

16. The method of claim 15, including coupling the second glass substrate to the first surface of the first glass substrate by direct glass-to-glass bonding.

17. The method of claim 15, including providing copper plating in the first and second vias.

18. A method to produce a glass core of a semiconductor die, the method comprising:

providing a trench in a first surface of a first glass substrate, the trench extending into the first glass substrate by a distance less than a thickness of the first glass substrate;

coupling a second glass substrate to the first surface of the first glass substrate across the trench, the trench and the second glass substrate to define a channel, the channel to receive cooling fluid to flow through the channel between a fluid inlet and a fluid outlet of the first glass substrate; and providing a photo imageable dielectric (PID) layer at an interface between the first and second glass substrates.

19. The method of claim 18, further including removing portions of the PID layer corresponding to locations of vias in the first and second glass substrates.

* * * * *